(12) United States Patent
Ward et al.

(10) Patent No.: US 8,525,143 B2
(45) Date of Patent: Sep. 3, 2013

(54) METHOD AND SYSTEM OF USING NANOTUBE FABRICS AS JOULE HEATING ELEMENTS FOR MEMORIES AND OTHER APPLICATIONS

(75) Inventors: Jonathan W. Ward, Fairfax, VA (US); Thomas Rueckes, Rockport, MA (US); Mitchell Meinhold, Medford, MA (US); Brent M. Segal, Woburn, MA (US)

(73) Assignee: Nantero Inc., Woburn, MA (US)

( * ) Notice: Subject to any disclaimer, the term of this patent is extended or adjusted under 35 U.S.C. 154(b) by 967 days.

(21) Appl. No.: 12/066,053

(22) PCT Filed: Sep. 6, 2006

(86) PCT No.: PCT/US2006/034626
§ 371 (c)(1), (2), (4) Date: Dec. 9, 2008

(87) PCT Pub. No.: WO2007/030483
PCT Pub. Date: Mar. 15, 2007

(65) Prior Publication Data
US 2010/0327247 A1    Dec. 30, 2010

Related U.S. Application Data

(60) Provisional application No. 60/714,390, filed on Sep. 6, 2005.

(51) Int. Cl.
*H01L 45/00* (2006.01)
(52) U.S. Cl.
USPC ................................... 257/2; 257/4
(58) Field of Classification Search
USPC .......................................... 257/2–5
See application file for complete search history.

(56) References Cited

U.S. PATENT DOCUMENTS

| 5,557,596 A | 9/1996 | Gibson et al. |
| 6,057,637 A | 5/2000 | Zettl et al. |

(Continued)

FOREIGN PATENT DOCUMENTS

| EP | 1 274 092 | 1/2003 |
| GB | 2 364 933 A | 2/2002 |

(Continued)

OTHER PUBLICATIONS

Ago, H. et al., "Workfunction of Puffed and Oxidised Carbon Nanotubes," Synthetic Metals 103 (1999) 2494-2495.

(Continued)

*Primary Examiner* — Cuong Q Nguyen
(74) *Attorney, Agent, or Firm* — Nantero Inc.

(57) ABSTRACT

Methods and systems of using nanotube elements as joule heating elements for memories and other applications. Under one aspect, a method includes providing an electrical stimulus, regulated by a drive circuit, through a nanotube element in order to heat an adjacent article. Further, a detection circuit electrically gauges the state of the article. The article heated by the nanotube element is, in preferred embodiments, a phase changing material, hi memory applications, the invention may be used as a small-scale CRAM capable of employing small amounts of current to induce rapid, large temperature changes in a chalcogenide material. Under various embodiments of the disclosed invention, the nanotube element is composed of a non-woven nanotube fabric which is either suspended from supports and positioned adjacent to the phase change material or is disposed on a substrate and in direct contact with the phase change material. A plurality of designs using various geometric orientations of nanotube fabrics, phase change materials, and drive and detection circuitry is disclosed. Additionally, methods of fabricating nanotube heat emitters are disclosed.

23 Claims, 18 Drawing Sheets

(56) References Cited

U.S. PATENT DOCUMENTS

| | | | |
|---|---|---|---|
| 6,277,318 | B1 | 8/2001 | Bower et al. |
| 6,342,276 | B1 | 1/2002 | You |
| 6,409,567 | B1 | 6/2002 | Amey, Jr. et al. |
| 6,423,583 | B1 | 7/2002 | Avouris et al. |
| 6,495,116 | B1 | 12/2002 | Herman |
| 6,495,258 | B1 | 12/2002 | Chen et al. |
| 6,515,339 | B2 | 2/2003 | Shin et al. |
| 6,528,020 | B1 | 3/2003 | Dai et al. |
| 6,630,772 | B1 | 10/2003 | Bower et al. |
| 6,635,951 | B1 | 10/2003 | Zahorik |
| 6,645,628 | B2 | 11/2003 | Shiffler, Jr. et al. |
| 6,706,402 | B2 | 3/2004 | Rueckes et al. |
| 6,707,098 | B2 | 3/2004 | Hofmann et al. |
| 6,808,746 | B1 | 10/2004 | Dai et al. |
| 6,833,558 | B2 | 12/2004 | Lee et al. |
| 6,858,197 | B1 | 2/2005 | Delzeit |
| 6,863,942 | B2 | 3/2005 | Ren et al. |
| 6,888,773 | B2 | 5/2005 | Morimoto |
| 6,890,780 | B2 | 5/2005 | Lee |
| 6,899,945 | B2 | 5/2005 | Smalley et al. |
| 6,905,892 | B2 | 6/2005 | Esmark |
| 6,918,284 | B2 | 7/2005 | Snow et al. |
| 6,919,592 | B2 | 7/2005 | Segal et al. |
| 6,919,740 | B2 | 7/2005 | Snider |
| 6,921,575 | B2 | 7/2005 | Horiuchi et al. |
| 6,924,538 | B2 | 8/2005 | Jaiprakash et al. |
| 6,946,410 | B2 | 9/2005 | French et al. |
| 7,057,402 | B2 | 6/2006 | Cole et al. |
| 7,566,478 | B2 | 7/2009 | Ward et al. |
| 2001/0004979 | A1 | 6/2001 | Han et al. |
| 2002/0110177 | A1 | 8/2002 | Nakayama et al. |
| 2002/0160111 | A1 | 10/2002 | Sun et al. |
| 2003/0004058 | A1 | 1/2003 | Li et al. |
| 2003/0122111 | A1 | 7/2003 | Glatkowski |
| 2003/0177450 | A1 | 9/2003 | Nugent |
| 2003/0198812 | A1 | 10/2003 | Rueckes et al. |
| 2003/0200521 | A1 | 10/2003 | DeHon et al. |
| 2004/0005723 | A1 | 1/2004 | Empedocles et al. |
| 2004/0007528 | A1 | 1/2004 | Bakajin et al. |
| 2004/0023253 | A1 | 2/2004 | Kunwar et al. |
| 2004/0031975 | A1 | 2/2004 | Kern et al. |
| 2004/0041154 | A1 | 3/2004 | Watanabe et al. |
| 2004/0043527 | A1 | 3/2004 | Bradley et al. |
| 2004/0071949 | A1 | 4/2004 | Glatkowski et al. |
| 2004/0099438 | A1 | 5/2004 | Arthur et al. |
| 2004/0104129 | A1 | 6/2004 | Gu et al. |
| 2004/0132070 | A1 | 7/2004 | Star et al. |
| 2004/0145941 | A1 | 7/2004 | Rust |
| 2004/0181630 | A1 | 9/2004 | Jaiprakash et al. |
| 2004/0253167 | A1 | 12/2004 | Silva et al. |
| 2004/0265550 | A1 | 12/2004 | Glatkowski et al. |
| 2004/0266106 | A1 | 12/2004 | Lee |
| 2005/0018588 | A1 | 1/2005 | Duerig et al. |
| 2005/0053525 | A1 | 3/2005 | Segal et al. |
| 2005/0095938 | A1 | 5/2005 | Rosenberger et al. |
| 2005/0212014 | A1 | 9/2005 | Horibe et al. |
| 2006/0237537 | A1 | 10/2006 | Empedocles et al. |
| 2007/0004191 | A1 | 1/2007 | Gu et al. |
| 2007/0012956 | A1* | 1/2007 | Gutsche et al. ............... 257/246 |

FOREIGN PATENT DOCUMENTS

| | | |
|---|---|---|
| JP | 2000203821 | 7/2000 |
| JP | 2001035362 A | 2/2001 |
| JP | 2004090208 A | 3/2004 |
| WO | WO-98/39250 A1 | 9/1998 |
| WO | WO-99/65821 A1 | 12/1999 |
| WO | WO-01/03208 A1 | 1/2001 |
| WO | WO-02/45113 A1 | 6/2002 |
| WO | WO-02/48701 A2 | 6/2002 |
| WO | WO-03/016901 A1 | 2/2003 |
| WO | WO-03034142 A1 | 4/2003 |

OTHER PUBLICATIONS

Ajayan, P.I M.et al., "Applications of Carbon Nanotubes." Topics in Applied Physics, vol. 80, pp. 391-425, 2001.

Akita, O. et al., "Nano-processing tool using carbon nanotube nano-heater," Microprocesses and Nanotechnology Conference, 2004. Digest of Papers, 2004 International Osaka, Japan, Oct. 27-29, 2004, IEEE, pp. 320-321.

Banerjee, S. et al., "Functionalization of Carbon Nanotubes with a Metal-Containing Molecular Complex," Nano Letters 2002, vol. 2, No. 1, pp. 49-53.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Cassell, a. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Chiang, I. W., et al., "Purification and Characterization of Single-Wall Carbon Nanotubes" J. Phys. Chem. B (2001) 105: 1157-1161.

International Search Report issued for corresponding International Patent Application No. PCT/US2006/034626.

Supplementary European Search Report and Opnion issued for corresponding European Patent Application No. EP 06802997.

Dai, H. et al, "Controlled Chemical Routes to Nanotube Architectures, Physics and Devices," J. Phys. Chem. B, Dec. 7, 1999, vol. 103, pp. 111246-111255.

Delzeit, L., et al., "Multilayered Metal Catalysts for Controlling the Density of Single-walled Carbon Nanotube Growth." Chemical Physics Letters, 348, 368, 2001.

Desai et al., "Freestanding Carbon Nanotube Specific Fabrication," Proc. of 2005 5th IEEE Conf., Nanotech., Nagoya, Japan, pp. 1-4, Jul. 2005.

Franklin, N. R. et al, "An Enhanced CVD Approach to Extensive Nanotube Networks with Directionality", Advanced Materials, pp. 890-894, 2002.

Haddon, R.C. et al., "Purification and Separation of Carbon Nanotubes," MRS Bulletin, Apr. 2002, pp. 252-259.

Hafner, J. H. et al., "Catalytic growth of single-wall carbon nanotubes from metal particles", Chemical Physics Letters, vol. 296, pp. 195-202, Oct. 30, 1998.

Homma, Y., "Single-Walled Carbon Nanotube Growth on Silicon Substrates Using Nanoparticle Catalysts", Jpn. J. Appl. Phys., vol. 41, pp. L89-L91, 2002.

Jeong et al., "A New Purification Method of Single-Wall Carbon Nanotubes Using H2S and O2 Mixutre Gas," chemical Physics Letters, vol. 344, pp. 18-22, Aug. 17, 2001.

Joselevich, E., "Vectorial Growth of Metallic and Semiconducting Single-Wall Carbon Nanotubes", Nano Letters, vol. 0, No. 0, A-E, 2002.

Kahn, Michael G. C., et al., "Solubilization of Oxidized Single-Walled Carbon Nanotubes in Organic and Aqueous Solvents through Organic Derivation" (2002) 2(11) 1215-1218.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors", Science, vol. 287, pp. 622-625, Jan. 28, 2000.

Li, J. et al., "Carbon Nanotube Nanoelectrode Array for Ultrasensitive DNA Detection", Nano Letters, vol. 3, No. 5, pp. 597-602, 2003.

Li, Y., et al., "Growth of Single-Walled Carbon Nanotubes from Discrete Catalytic Nanoparticles of Various Sizes", The Journal of Physical Chemistry B, vol. 105, p. 11424-11431, 2001.

Li, Yan et al. "Preparation of Monodispersed Fe-Mo Nanoparticles as the Catalyst for CVD Synthesis of Carbon Nanotubes." Chemical Material (2001): 13; 1008-1014.

Nerushev, O. A., et al., "Carbon nanotube films obtained by thermal chemical vapour deposition", J. Mater. Chem., vol. 11, pp. 1122-1132, 2001.

Niu, C. et al., "High power electrochemical capacitors based on carbon nanotube electrodes," Appl. Phys. Lett 70 (11), Mar. 17, 1997, pp. 1480-1482.

Onoa et al., "Bulk Production of Singly Dispersed Carbon Nanotubes with Prescribed Lengths", Nanotechnology, vol. 16, p. 2799-2803, 2005.

Parikh, K. et al., "Flexible vapour sensors using single walled carbon nanotubes", Sensors and Actuators B, vol. 113, pp. 55-63, 2006.

Peigney, A. et al. "A Study of the Formation of Single- and Double-Walled Carbon Nanotubes by a CVD Method", Journal of Physical Chemistry B, vol. 105, pp. 9699-9710, 2001.

Purcell, S.T. et al., "Hot nanotubes: stable heating of individual multiwall carbon nanotubes to 2000 K induced by the field-emission current," Physical Review Letters APS USA, vol. 88, No. 10, Mar. 11, 2002, pp. 105502/1-4.

Qi, P. et al., "Toward Large Arrays of Multiplex Functionalized Carbon Nanotube Sensors for Highly Sensitive and Selective Molecular Detection", Nano Letters, vol. 3, No. 3, pp. 347-351, 2003.

Shelimov, Konstantin B., et al., "Purification of single-wall carbon nanotubes by ultrasonically assisted filtration" Chemical Physics Letters (1998) 282: 429-434.

Sotiropoulou, S. et al., "Carbon nanotube array-based biosensor", Anal. Bioanal. Chem, vol. 375, pp. 103-105, 2003.

Valentini, L. et al., "Sensors for sub-ppm $NO_2$ gas detection based on carbon nanotube thin films," Applied Physics Letters, vol. 82, No. 6, Feb. 10, 2003, pp. 961-963.

Zhang et al., "Formation of metal nanowires on suspened signel-walled carbon nanotubes", *Appl. Phys. Lett.*, vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 4 pages, Jun. 19, 2001.

Zhao, Y. P. et al., Frequency-dependent electrical transport in carbon nanotubes, Physical Review B., vol. 64, pp. 201402-1 to 201402-4, 2001.

Ajayan, et al., "Nanometre-size tubes of carbon," Rep. Prog. Phys. vol. 60, 1997, pp. 1025-1062.

Berber, et al., "Unusually High Thermal Conductivity of Carbon Nanotubes," Phys. Rev. Ltrs., vol. 84, No. 20, May 15, 2000, pp. 4613-4616.

Crowley, et al., "512 Mb PROM with 8 layers of antifuse/Diode cells," IEEE International Solid-State Circuits Conference, vol. XLVI, Feb. 2003, pp. 284-285.

Fuhrer, et al., "High-Mobility Nanotube Transistor Memory," Nano Letters, vol. 2, No. 7, 2002, pp. 755-759.

Novak, et al., "Nerve Agent Using Networks of Single-Walled Carbon Nanotubes," Appl. Phys. Ltr., vol. 83, No. 19, Nov. 2003, pp. 4026-4028.

Snow, et al., "Random Networks of Carbon Nanotubes as an Electronic Material," App. Phys. Ltrs., vol. 82, No. 13, Mar. 2003, pp. 2145-2147.

Star, et al., "Nanoelectronic Carbon Dioxide Sensors," Adv. Mater., vol. 16, No. 22, 2004, pp. 2049-2052.

Star, et al., "Nanotube Optoelectronic Memory Devices," Nano Letters, vol. 4, No. 9, 2004, pp. 1587-1591.

Yao, et al., "High-Field Electrical Transport in Single-Wall Carbon Nanotubes," Phys. Rev. Ltrs., vol. 84, No. 13, Mar. 27, 2000, pp. 2941-2944.

Zhou, et al., "p-Channel Thin Film Transistors and p-n Diodes Based on Single Wall Carbon Nanotube Networks," Nano Letters, vol. 4, No. 10, 2004, pp. 2031-2035.

* cited by examiner

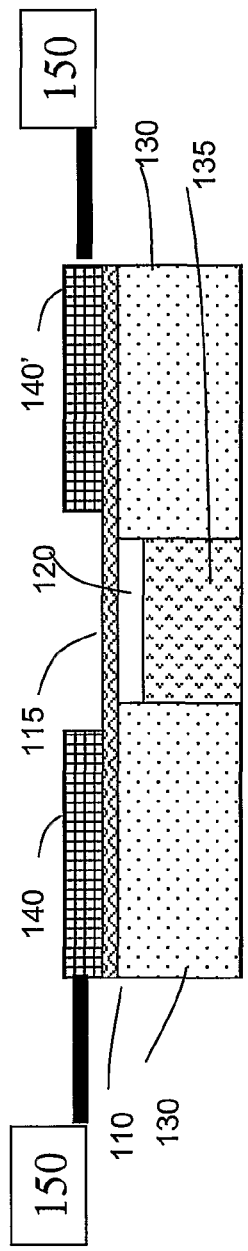
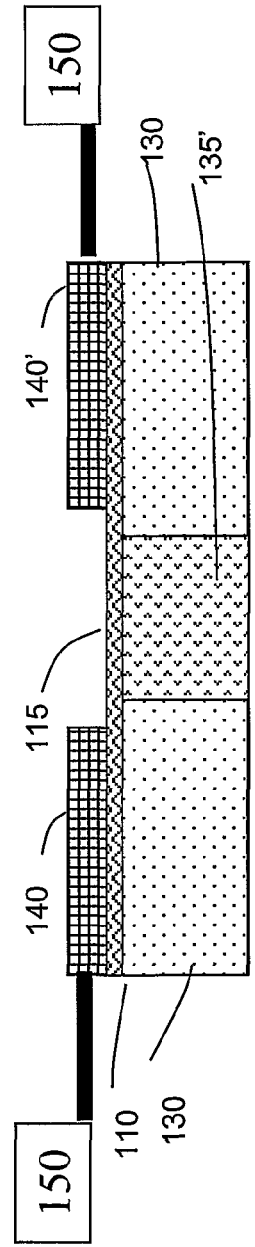

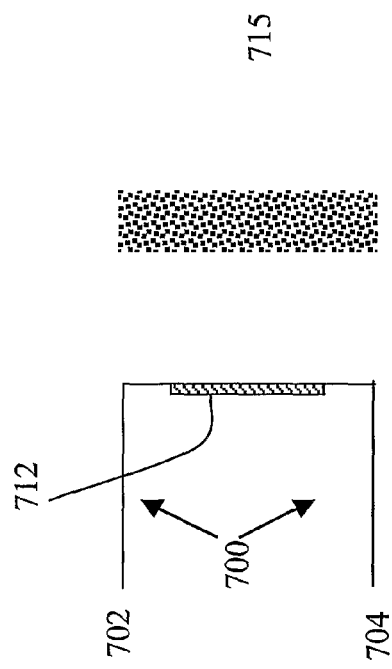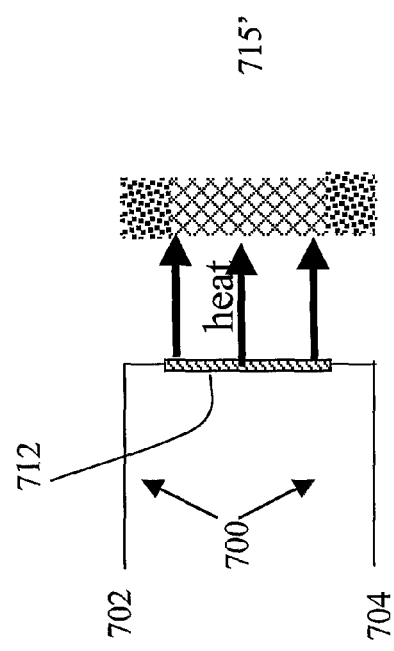

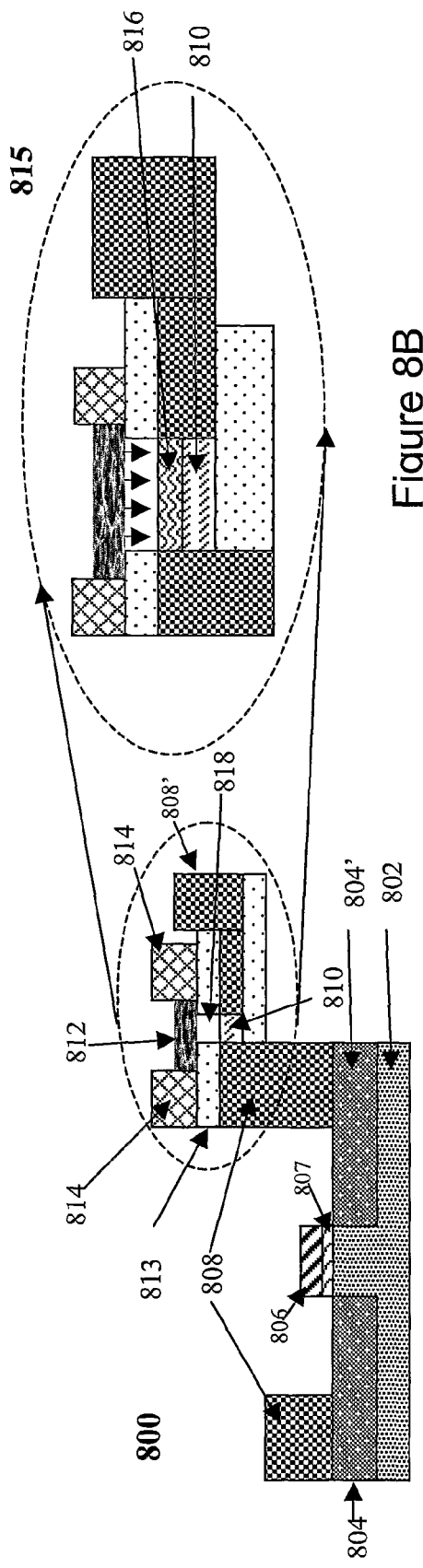
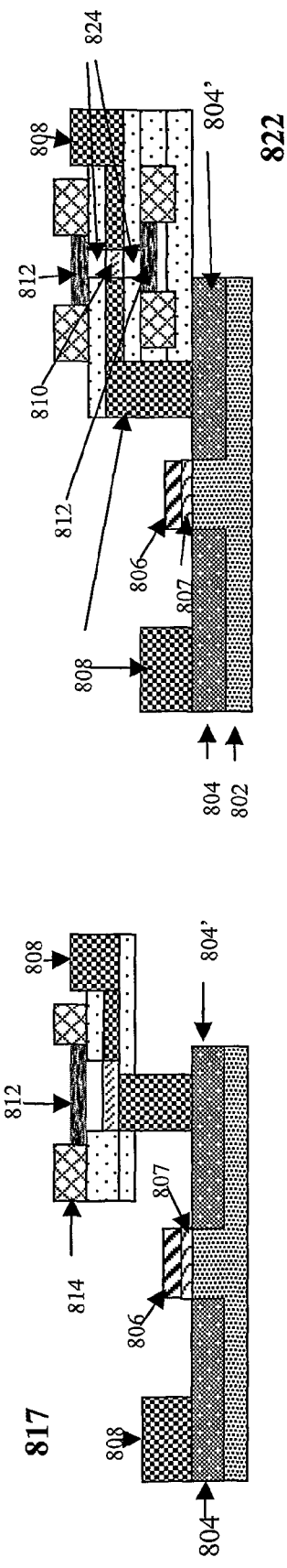
Figure 8A
Figure 8B
Figure 8C
Figure 8D

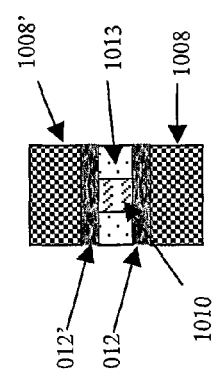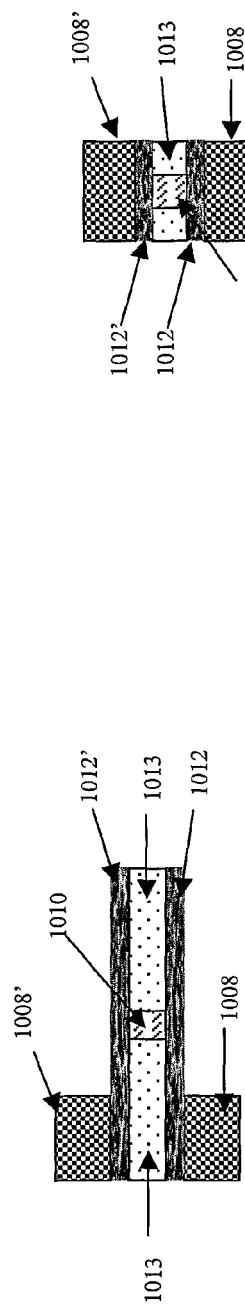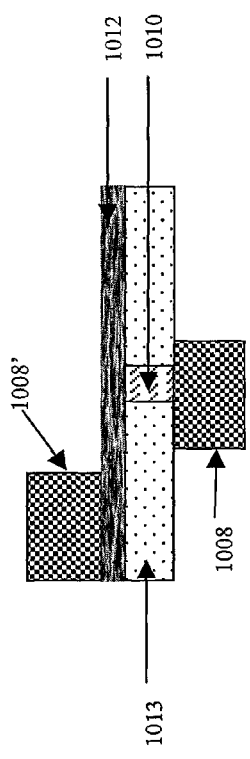
Figure 10A
Figure 10B
Figure 10C

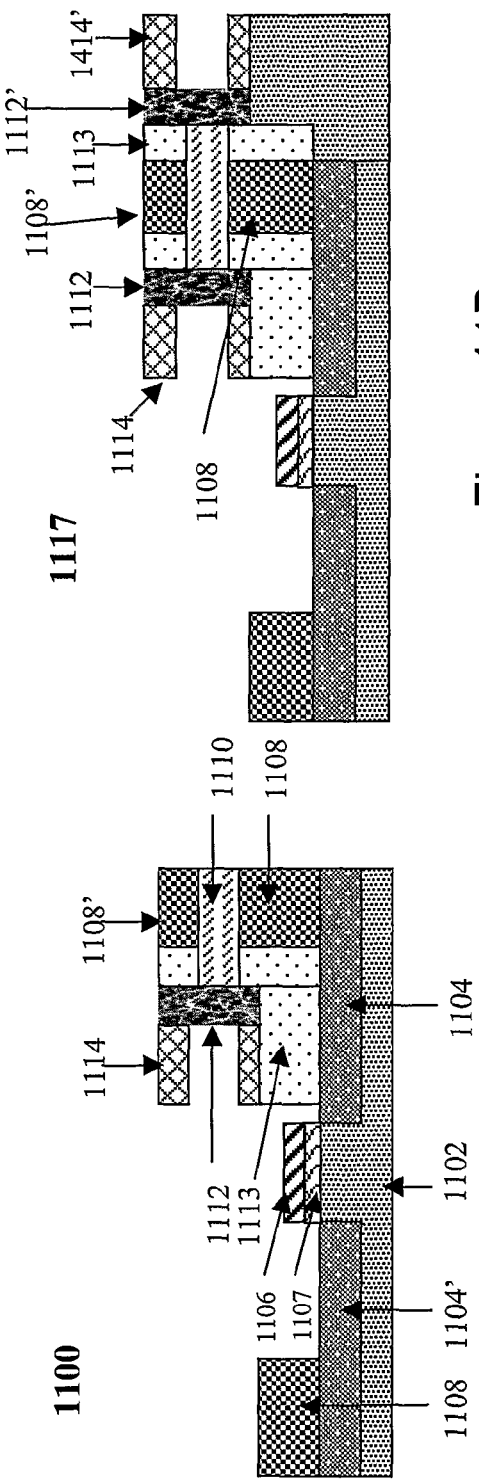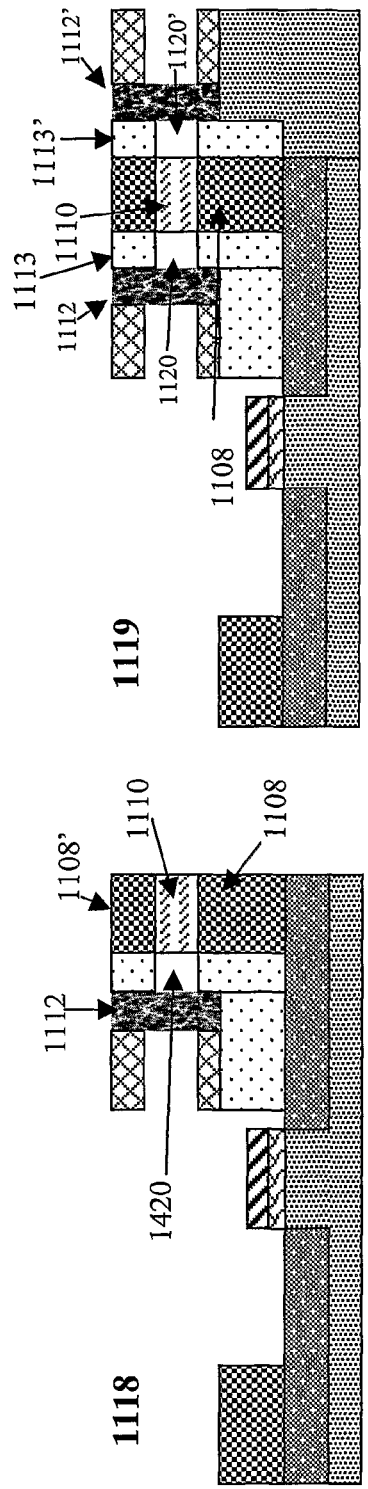
Figure 11A
Figure 11B
Figure 11C
Figure 11D

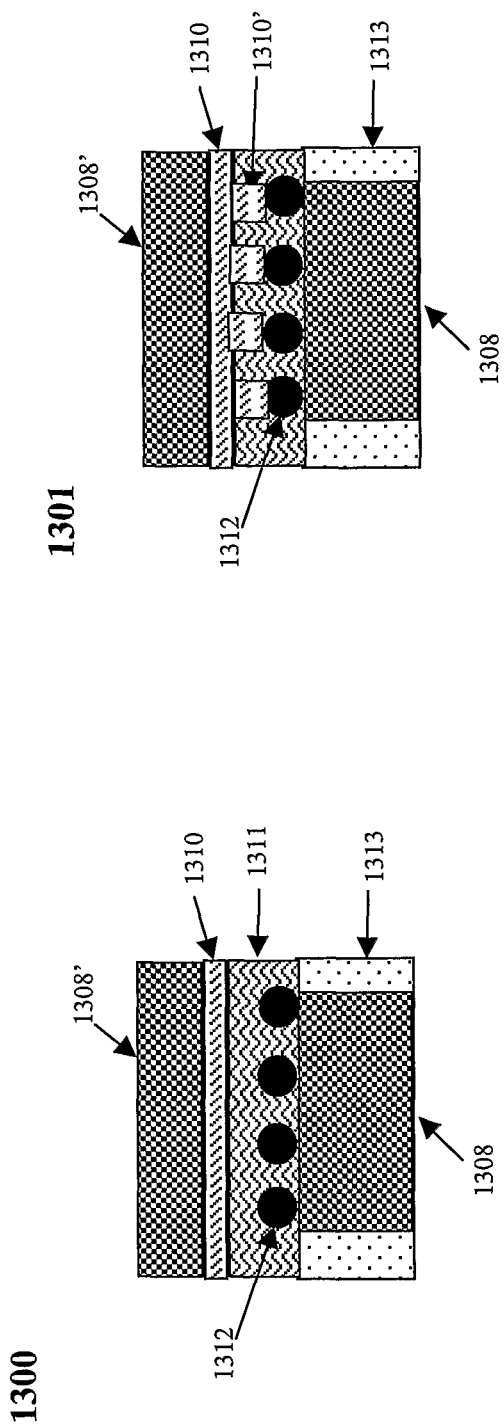

Figure 15
(Key for Figures 8-13)
CNT Fabric
Crystalline Chalcogenide
Silicon
Metal 1
Gate Electrode
Gate Dielectric
Chalcogenide
Dielectric Substrate
Metal 2
Source/Drain
        

METHOD AND SYSTEM OF USING NANOTUBE FABRICS AS JOULE HEATING ELEMENTS FOR MEMORIES AND OTHER APPLICATIONS

CROSS-REFERENCE TO RELATED APPLICATIONS

This application is a U.S. National Phase Application under 35 U.S.C.§371 of International Patent Application No. PCT/US2006/034626, filed Sep. 6,2006, entitled "Method and System of Using Nanotube Fabrics as Joule Heating Elements for Memories and Other Applications," which claims the benefit under 35 U.S.C. §119(e) to U.S. Provisional Pat. Application. No. 60/714,390, filed on Sep. 6, 2005, entitled "Method and System of Using Nanotube Fabrics as Joule Heating Elements for Memories and Other Applications," the entire contents of each is incorporated herein by reference.

BACKGROUND

1. Technical Field

The present application relates generally to carbon nanotube fabrics and methods of making same for use in heat emitting systems, and, more specifically, to the utilization of such nanotube heating elements for the changing of phases of a material, such as a chalcogenide material.

2. Discussion of Related Art

Small heating elements are useful for many applications such as changing the phase of chalcogenide memory devices. The use of electrically writable and erasable phase change materials (i.e., materials which can be electrically switched between non-crystalline and crystalline states or between different resistive states while in crystalline form) for electronic memory applications are known in the art and are disclosed, for example, in U.S. Pat. No. 6,635,951 to Zahorik, the entire contents of which are incorporated herein by reference.

There is an ever-greater need for smaller-scale devices. Carbon nanotubes (NTs) are being used in many different applications in the field of electronics and are found to be useful due to their electrical (i.e. conducting or semi-conducting), mechanical, optical, chemical and thermal properties.

Carbon nanotubes, with tube diameters around 1-2 nm, are electrical conductors that are able to carry extremely high current densities, see, e.g., Z. Yao, C. L. Kane, C. Dekker, Phys. Rev. Lett. 84, 2941 (2000), the entire contents of which are incorporated herein by reference. They also have the highest known heat conductivity, see, e.g., S. Berber, Y.-K. Kwon, D. Tomanek, Phys. Rev. Lett. 84, 4613 (2000), and are thermally and chemically stable, see, e.g., P. M. Ajayan, T. W. Ebbesen, Rep. Prog. Phys. 60, 1025 (1997), the entire contents of which are incorporated herein by reference. Due to their properties, carbon nanotubes have been shown to emit heat due to resistive current conduction.

Using individual nanotubes for heat emission, however, can be problematic because of difficulties in growing them with suitably controlled orientation, length, and the like.

There is a need in the art for very efficient, very small, even submicron-sized heat transfer elements which are easily fabricated and are compatible with electronics applications and fabrication techniques. There is likewise a need in the art for large scale fabrication methods of nanoscale heat emitters used for electronic applications in the semiconductor industry which can be monolithically integrated into a CMOS or similar process flow to fabricate integrated circuits. Rapid cycling of heating elements would provide a technique for switching the states of materials. In certain applications it might be beneficial to allow heat transmission to occur for extended periods of time with exquisite temperature control. Naturally, the uses of such elements extend to most types of consumer electronics where heat emission in integrated elements is beneficial.

BRIEF DESCRIPTION OF THE DRAWINGS

In the Drawing:

FIGS. 1A-1C illustrate nanotube-based heat emitting elements and arrays thereof according to certain embodiments of the invention.

FIGS. 7A-7B schematically illustrate heat emission from a nanotube-based heat emitter to an adjacent material, according to certain embodiments of the inventions.

FIGS. 8A-8D illustrates intermediate structures formed during a method of making a nanotube-based heat emitting element according to certain embodiments of the invention.

FIGS. 10A-10E illustrate various embodiments of nanotube-based heating elements.

FIGS. 11A-11D illustrate various embodiments of nanotube-based heating elements.

FIGS. 13A-13B illustrate various embodiments of nanotube-based heating elements.

FIG. 15 is a key showing exemplary materials used in the embodiments of FIGS. 8A-8D, 9, 10A-10E, 11A-11D, 12A-12B, and 13A-13B.

SUMMARY OF THE INVENTION

Figure 1C:
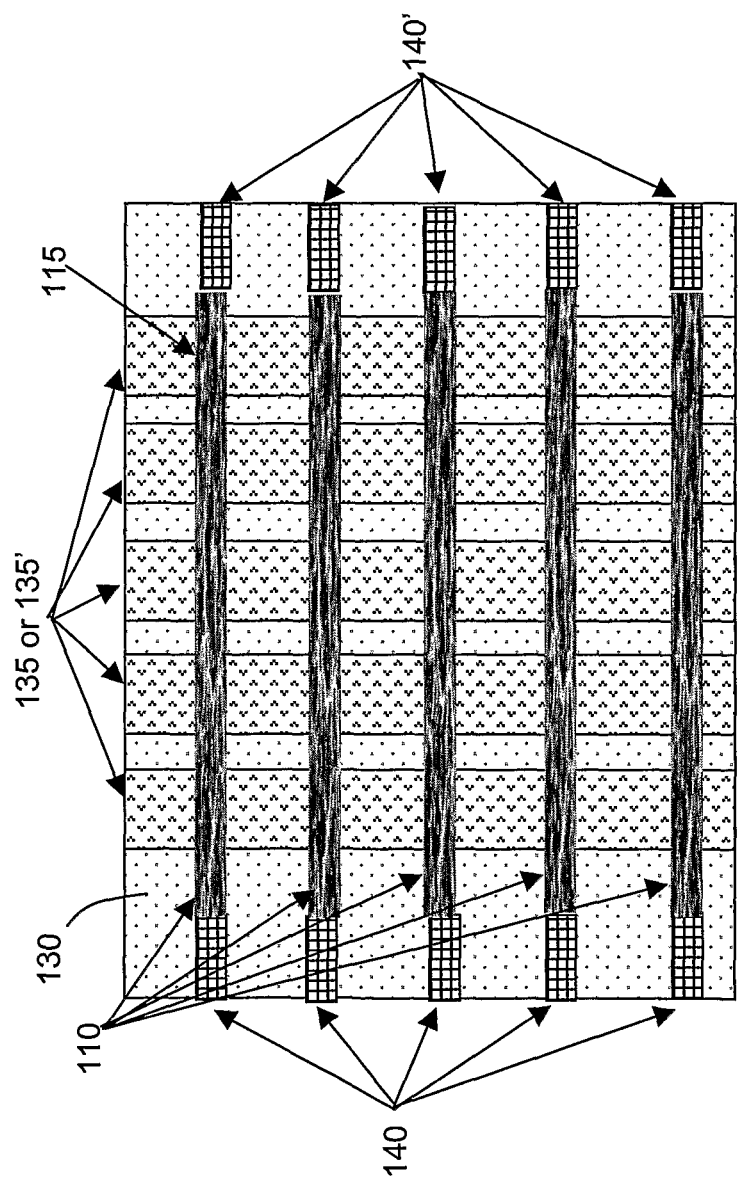

The invention provides methods and systems of using nanotube elements as joule heating elements for memories and other applications.

Under one aspect of the invention, a nanotube element with predefined geometry is positioned in proximity to and in thermal communication with an article to be heated. The nanotube element is electrically stimulated with a predefined electrical signal to induce the emission of a particular amount of heat over a particular period of time.

Under another aspect of the invention, a nanotube element is separated from the article to be heated by a gap of predefined dimensions.

Under another aspect of the invention, a nanotube element is in physical contact with a surface of the article to be heated.

Under another aspect of the invention, the nanotube element includes a non-woven fabric of unaligned nanotubes.

Under another aspect of the invention, a current less than about 100 µA applied to the nanotube element induces a change in temperature greater than about 100 Kelvin over a time period of less than about 1 picosecond.

Under another aspect of the invention, a nanotube heat-emitter circuit includes a phase-changing material having a plurality of physical states, each state activatable in response to heat stimulus, and a detection circuit in electrical communication with the phase-changing material to detect the physical state of said material. A heat emitting element is adjacent to the phase changing material to emit heat in response to an electrical stimulus. The heat emitting element includes a nanotube element in thermal communication with the phase-changing material and capable of transforming the physical state of the material in response to electrical stimulus.

Under another aspect of the invention, the nanotube element includes a network of unaligned nanotube segments which generally extend along a length of the element.

Under another aspect of the invention, the nanotube element includes a nonwoven fabric of unaligned nanotubes.

Under another aspect of the invention, the circuit includes a support structure defining a gap in which the phase changing material is positioned. The nanotube element is supported by the support structure and suspended over the gap. The suspended portion of the nanotube element is the heat-emitting active region. The nanotube element is suspended by the support structure in a fixed spaced relation to and thermal communication with the phase changing material.

Under another aspect of the invention, the suspended portion of the nanotube element extends approximately 130 nm in one dimension and 3 to 5 µm in another dimension.

Under another aspect of the invention, the support structure upon which the nanotube element is suspended includes one or more materials whose electrical properties are insulating and whose thermal properties are less thermally conductive than the nanotube element.

Under another aspect of the invention, the circuit includes a support structure defining a gap in which the phase changing material is positioned. The nanotube element is positioned in direct physical contact with the support structure and the phase changing material. The portion of the nanotube element in direct contact with the phase change material is the heat-emitting active region. The nanotube element is supported by the support structure and is in thermal and electrical communication with the phase changing material.

Under another aspect of the invention, the support structure upon which the nanotube element is disposed includes one or more materials whose electrical properties are insulating and whose thermal properties are less thermally conductive than the nanotube element.

Under another aspect of the invention, the support structure is interposed between the active region of the nanotube heating element and the phase changing material.

Under another aspect of the invention, the nanotube element generally extends either perpendicularly or in an orientation parallel to the major surface of the substrate.

Under another aspect of the invention, the detection circuit includes at least two conductive electrodes in electrical communication with the phase changing material and capable of using an electrical stimulus to measure an electrical resistance of the phase changing material. These electrodes are not in electrical communication with the nanotube element.

Under another aspect of the invention, the detection circuit includes at least two conductive electrodes capable of applying electrical stimulus to the nanotube element and measuring the resistance of the phase changing material.

Under another aspect of the invention, the phase changing material is in thermal and electrical communication with a second nanotube element spatially separated from the previously mentioned nanotube element by a support structure.

Under another aspect of the invention, the phase-changing material comprises a chalcogenide capable of at least two memory states.

Under another aspect of the invention, a method of making a heat sensitive memory circuit includes providing a substrate with a defined portion of phase change material, and forming a nanotube element in proximity to the phase change material. A drive circuit in electrical communication with the nanotube element is provided to electrically stimulate the nanotube element and induce the element to generate heat.

Under one aspect, a method includes providing an electrical stimulus, regulated by a drive circuit, through a nanotube element in order to heat an adjacent article. Further, a detection circuit electrically gauges the state of the article. The article heated by the nanotube element is, in preferred embodiments, a phase changing material. In memory applications, the invention may be used as a small-scale CRAM capable of employing small amounts of current to induce rapid, large temperature changes in a chalcogenide material. Under various embodiments of the disclosed invention, the nanotube element includes a non-woven nanotube fabric which is either suspended from supports and positioned adjacent to the phase change material or is disposed on a substrate and in direct contact with the phase change material. A plurality of designs using various geometric orientations of nanotube fabrics, phase change materials, and drive and detection circuitry is disclosed. Additionally, methods of fabricating nanotube heat emitters are disclosed.

DETAILED DESCRIPTION

Preferred embodiments use nanotubes and nanotube fabrics as heat emitters in applications requiring local, small-scale heating devices. The present invention can be used in the construction of Chalcogenide Random Access Memory (CRAM) elements by employing nanotube heat emitters to control the phase of chalcogenide materials. Nanotube heat emitters can be electrically stimulated to create extremely high temperatures over short periods of time when an extremely small current is passed through them. When constructed with the appropriate geometry and controlled with the appropriate drive circuitry, nanotube heat emitters in memory applications offer a significant advantage when compared to traditional CRAM elements by functioning with a small operating current and allowing changes of memory state over short time periods. Such memory elements can be constructed in arrays and used in memory systems. The nanotube heating element and circuitry disclosed here can also be used to change the phase of various other conducting and insulating materials and efficiently control those materials' physical states.

Fabrics of carbon nanotubes, conducting modest current, can be resistively heated to extremely high temperatures, e.g. greater than 600° C., in non-oxidizing atmospheres such as nitrogen or argon or under vacuum. Radiative heat loss can be observed from these devices during such resistive heating.

Single-walled and multi-walled carbon nanotubes emit heat from the regions that are suspended over a gap while an electrical current is passed through them. When the supports are made of electrically and thermally conducting material, the heat emission occurs chiefly in the suspended region of the nanotubes, not in the regions of the nanotubes in contact with the supports or metal interconnects.

Although suspended NTs emit heat with higher efficiencies, non-suspended NTs also produce and emit heat during the passage of a current. The major divergence from the suspended NTs is that a large amount of the generated heat is passed into the supporting substrate between the metal interconnects.

These NT heat emitters have several important and unique features that are not available with existing technologies. First, VLSI arrays of these NT heat emitters can be formed using patterning technology at minimum dimensions of the lithography node used, i.e. Giga-sized NT heat emitter arrays can be fabricated at 150 nm or smaller critical feature size. Such methods are more fully described in the incorporated patent references. Second, such nanofabric-based emitting devices scale directly with the lithographic ground rule used, i.e. 180 nm, 130 nm, 90 nm and 65 nm sized emitters can be produced. Passing a current through the nanotube-based fabrics in these nanosized cavities (area between metal interconnects) will lead to heat emission. Third, heat emission in these embedded arrays can be individually controlled (turned on/off) by transistors. This is the first demonstration of a manufacturable technology that can be integrated at a level of as few as one heat emitter per transistor/memory cell. Fourth, these NT heating elements can be employed to change the phase of various conducting and insulating materials through a transfer of heat from the NT fabric to the phase change material, where a phase can be described as crystalline (polycrystal and single crystal) to amorphous or amorphous to crystalline or solid to liquid, liquid to gas and solid to gas.

It was found that temperature changes of several hundred Kelvin (K) can be induced by passing very small currents through these nanotube heater structures (<100 μA). It is also important to note, that these temperature changes may take place on very short timescales, down to sub-picosecond.

Under preferred embodiments, it is possible to integrate 1 heat emitter per transistor at minimum dimension at a given lithography node, making it possible to fabricate a 1T1R memory element. Monolithic integration of VLSI arrays becomes possible while previously only discrete components could be used as heat emitters.

FIG. 1A illustrates an exemplary heat-emitting element 100 constructed according to principles of preferred embodiments of the invention. Heat emitting element 100 includes a nanotube ribbon 110, a suspended region 115 of nanotube fabric, a gap region 120, substrate 130, electrodes 140 and 140' (which may include metals such as Ru, Ti, Cr, Al, Au, Pd, Ni, W, Cu, Mo, Ag, In, Ir, Pb, Sn, as well as other suitable metals, and metal alloys such as TiAu, TiCu, TiPd, PbIn, and TiW, or conductive nitrides, oxides, or silicides such as RuN, RuO, TiN, TaN, CoSi$_x$ and TiSi$_x$ and driving circuitry 150.

The nanotube ribbon 110 of certain embodiments is formed from a non-woven fabric of entangled or matted nanotubes. The nanotube fabric 110 is disposed on the substrate and may be created by spin coating or any other appropriate method. The nanotube fabric may be patterned, e.g., by lithography, as described in the incorporated patent references.

Insulating layer 130 may include any appropriate dielectric material such as, but not limited to SiO$_2$ and any silica based derivative, silicon nitride or other non-conductive nitrides, alumina, sapphire, Mylar, plastics and other flexible substrates.

In preferred embodiments, heat-emitting elements have a suspended region 115 of nanofabric overlying a gap 120, above a second substrate material—the material to be heated—135. The material to be heated may be a similar insulator material to substrate 130 or another material such as semiconductors, metals, glasses, ceramics and polymers. Material 135 will be directly affected by the heating produced by the active heating nanotube region 115; therefore, material 135 is also the area that will be heated by nanotube fabric 110, more specifically suspended nanotube fabric 115.

The heat emission from the emitting element 110 is controlled by driving circuitry 150. Proper and necessary voltages are described herein below.

Substrate 130 may also be porous in that heat can be emitted from suspended nanotube fabric regions lying over pores in the substrate 130. The pores need not be uniformly distributed, and materials such as filter paper, membranes or plastics may be used as a porous substrate. Such heat emitters are useful for flexible electronics over wide areas which could be advantageous for certain phase change materials or polymeric materials that react under elevated temperatures.

FIG. 1B illustrates another aspect of this invention (structure 101) in which the nanotube heating element 110 is not suspended in region 115, but is in physical and conformal contact with an underlying substrate 135'; therefore, there is no gap region between active nanotube heating region 115 and the material that is directly affected by heating 135'.

FIG. 1C illustrates an array 102 of emitting elements 100 or 101, depending on whether nanotube fabric 115 is suspended or non-suspended, respectively. Each element 115 (designated only once) is capable of acting as a heating element 100 or 101 to heat material 135 or 135' at the junction of the nanotube fabric 110.

Exemplary Emitter Fabrication

Suspended single wall nanotube (SWNT) devices were fabricated by spin coating nanotubes onto silicon wafers and patterning the coating of nanotubes into traces which cross perpendicularly 90 nm to 250 nm wide sacrificial layers. Patterning was accomplished using lithography and plasma etching. Subsequently, the SWNT traces were interconnected using metal electrodes. These metal electrodes are positioned at a distance of about 60 nm from the suspended gap. Such fabrication is more fully described in incorporated references.

For non-suspended devices, no sacrificial layer is required and the active region of the nanotube nanoheater is defined as the region in between the low resistance contacts.

Current can be passed through these nanotube fabrics and local heating of these fabrics can be utilized for applications requiring local, nano-sized heating of devices. The heat emitted by the nanofabric elements can be controlled by the applied voltage amplitude, hence current.

New heat emitting materials and methods for making same are disclosed in which the suspended nanotube fabric elements may be created in the incorporated patent references. Nanofabric ribbons or segments or belts made from a matted layer of nanotubes or a non-woven fabric of nanotubes are used as a conductive element that emits heat. At points in this disclosure, the ribbons are referred to as traces or emitting or resistive articles. Generally, the ribbons are suspended, but in some instances they are disposed on a substrate.

Under certain embodiments of the invention, the resistive articles may be made from a nanotube fabric, layer or film. As stated above, carbon nanotubes, with tube diameters as little as 1 nm, are electrical conductors that are able to carry extremely high current densities, see, e.g., Z. Yao, C. L. Kane, C. Dekker, Phys. Rev. Lett. 84, 2941 (2000), have the highest known heat conductivity, see, e.g., S. Berber, Y.-K. Kwon, D. Tomanek, Phys. Rev. Lett. 84, 4613 (2000), and are thermally and chemically stable, see, e.g., P. M. Ajayan, T. W. Ebbesen, Rep. Prog. Phys. 60, 1025 (1997).

Creating traces of patterned nanotube fabrics overcomes at least some of the difficulties in growing the NTs with suitably controlled orientation, length, and the like and allows the traces to retain many if not all of the benefits of individual nanotubes. Moreover, traces made from nanotube fabric have benefits not found in individual nanotubes. For example, since the traces are composed of many nanotubes in aggregation, the trace will not fail as the result of a failure or break of an individual nanotube. Instead, there are many alternate paths through which electrons may travel within a given trace. In effect, a trace made from nanotube fabric creates its own electrical network of individual nanotubes within the defined trace, each of which may conduct electrons. Moreover, by using nanotube fabrics, layers or films, current technology may be used to create such traces.

Because nanotube-based heat emitting elements may be fabricated similarly to the suspended nanotube-based memory elements described in the incorporated patent references, the current description of their architecture is brief.

Figure 2A:
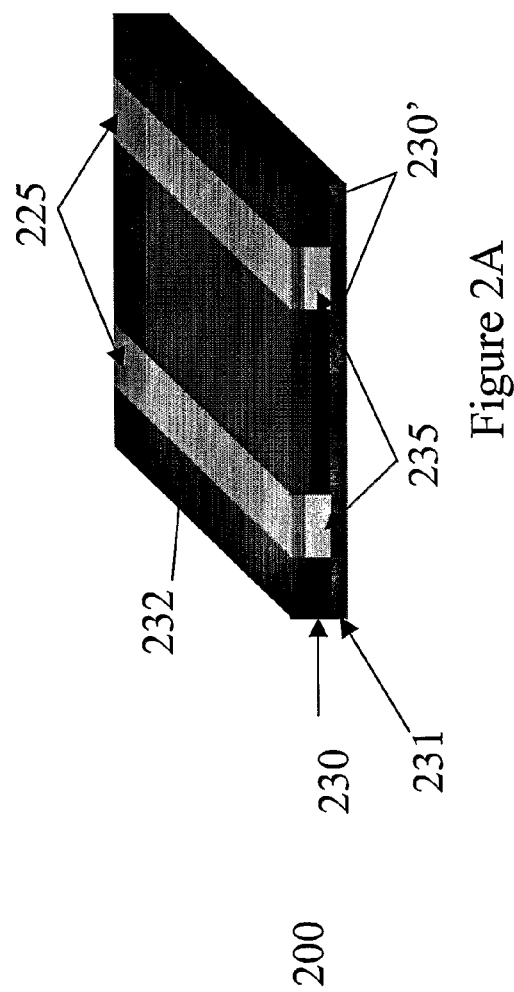
FIG. 2A-2D illustrate intermediate structures formed during a method of making a nanotube-based heat emitting element according to certain embodiments of the invention.

FIGS. 2A-2D illustrates intermediate structures formed during a non-limiting method of making certain embodiments of emitting elements 100. As shown in FIG. 2A, a first intermediate structure 200 is created or provided. In the illustrated embodiment, the structure 200 includes a silicon substrate 231 having a silicon nitride layer ($Si_3N_4$) 230 that defines a plurality of supports 230'. In this instance, the supports 230' are formed by rows of patterned silicon nitride, though many other arrangements and/or materials are possible, such as a plurality of columns, or even unconnected wells (not shown). Substrate 231 may also include other semiconducting materials such as Ge, GaAs, GaN, etc. or other conducting or non-conducting materials such as metals, oxides, glasses, nitrides, plastics, ceramics, filters, membranes or papers. Silicon Nitride layer 230 may also include any insulating material such as, but not limited to, silicon dioxide, silicon-oxy-nitride, alumina, magnesium oxide and titanium oxide.

Area to be heated 235 and sacrificial layers 225 are disposed between the supports 230' so as to define one planar surface 232 with the upper surface of the supports 230'. This planar surface may accept a spin-coated fabric of nanotubes (see intermediate structure 201, FIG. 2B). This planar surface, as will be explained below, may also facilitate growth of a matted nanotube layer of certain embodiments, (e.g. when catalyst is deposited and CVD growth is performed; not shown but explained in the incorporated patent references).

Figure 2B:
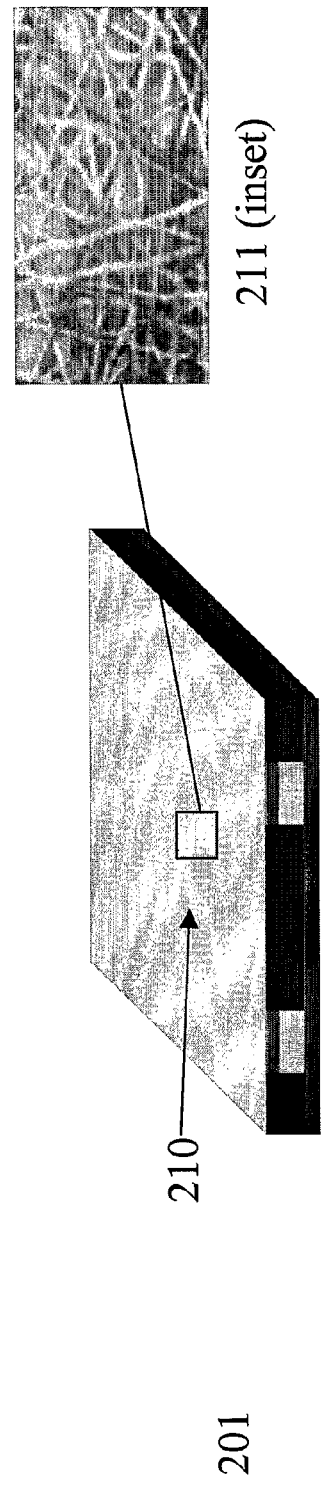

As shown in FIG. 2B, once such a structure 200 is created or provided, a fabric of carbon nanotubes 210 is created, e.g. by spin coating or aerosol application, and is disposed on intermediate structure 200, thus forming intermediate structure 201. A micrograph of a nanofabric is shown in inset 211. Further details on the formation of nanotube fabrics may be found in the incorporated patent references.

Figure 2C:
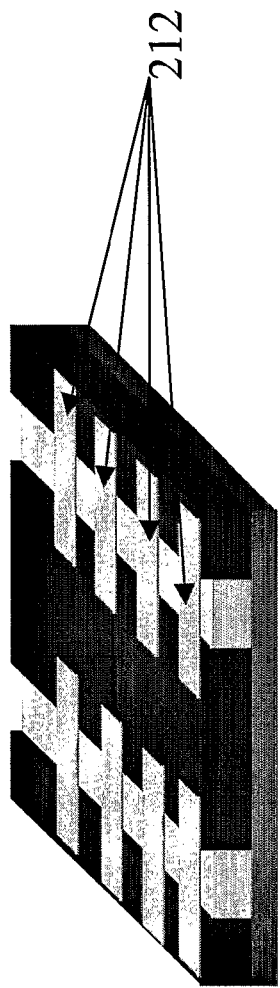

The fabric of nanotubes 210 is then patterned into ribbons 212, shown in FIG. 2C structure 202. The sacrificial layers 225 are removed, e.g. by etching, leaving intermediate structure 202.

Figure 2D:
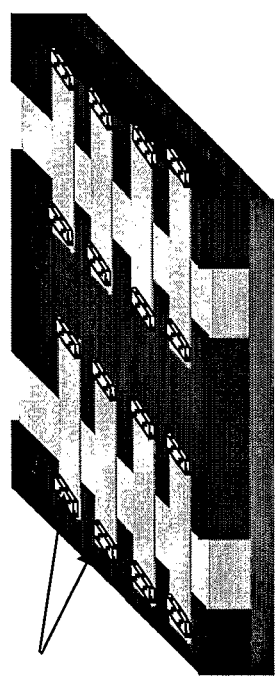
Figure 3:
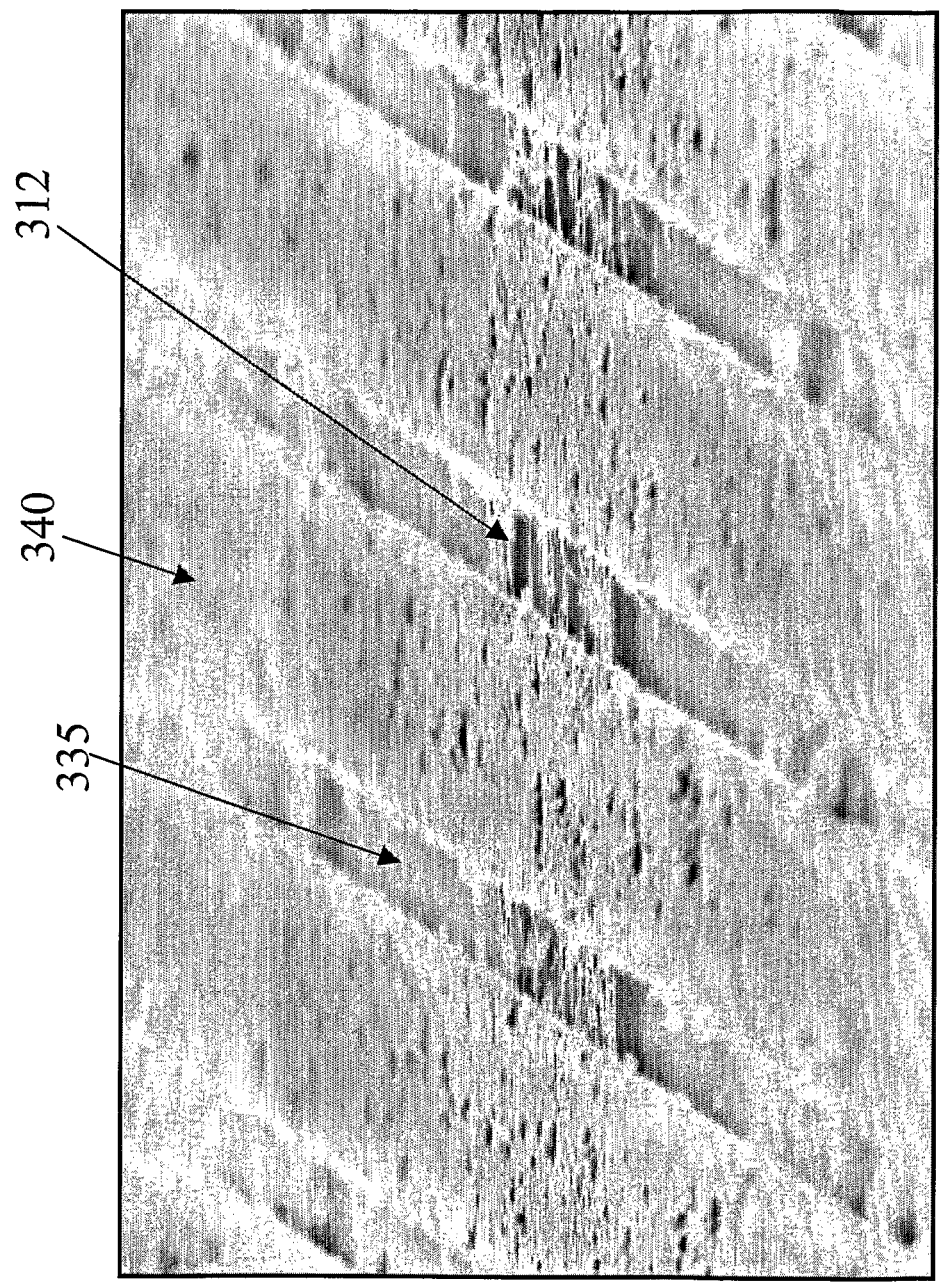
FIG. 3 is a micrograph of a patterned nanotube fabric suitable for use as a nanotube-based heat emitting element according to certain embodiments of the invention.

Contacts 240 are then applied to ribbons 212, forming structure 203 of FIG. 2D: an array of heat emitting elements, (subsequent interconnection is not shown for the sake of brevity and clarity). Contacts 240 may include metals such as, but not limited to, Ru, Ti, Cr, Al, Au, Pd, Ni, W, Cu, Mo, Ag, In, Ir, Pb, Sn, as well as other suitable metals, and metal alloys such as TiAu, TiCu, TiPd, PbIn, and TiW, or conductive nitrides, oxides, or silicides such as RuN, RuO, TiN, TaN, $CoSi_x$ and $TiSi_x$ FIG. 3 is a micrograph of a patterned nanotube ribbon, which may be used, e.g., as nanotube ribbons 212 in FIG. 2C and 2D. Each nanotube in the patterned fabric is about 1.5 nm in diameter. Structure 300 includes patterned nanotube fabric 312, conductive contacts 340 and area 335 that will be directly affected by heat produced from the nanotubes.

Though most of the disclosure above is written as if the fabric were made of nanotubes of the same type, e.g., all single-walled, the fabrics may be composed of all multi-walled structures or of a combination of single- and multi-walled structures.

The above embodiments of nanotube-based emitting elements use traces or electrically conductive articles made from nanotube layers 210, such as those shown in FIGS. 2A-2D. The layers may have thickness of about 1 nm or less, i.e., the thickness of a given nanotube. The nanotube matte 210 is grown or deposited on a surface, such as that of a silicon dioxide wafer, to form a contiguous film of a given density. The same two dimensional film that is patterned into discrete emitting elements can also be patterned to generate conductively interconnecting traces ranging in width from 1 nm (the intrinsic minimum size of a nanotube) to hundreds of microns or greater, depending on the application and context, as well as other kinds of nanotube-based devices such as those described in the incorporated patent references.

Heat emitting elements may be suspended as stated above, or they may lie on surfaces of materials whose electrical properties are insulating and thermal properties are less thermally conductive than the nanotube fabric. Such materials include, but are not limited to: insulators, semiconductors, polymers, ceramics, and lower thermal conductance metals than nanotubes—nanotubes have higher thermal conductivity than most metals; however, the nanotubes overall thermal conductance may be lower.

Figure 4B:
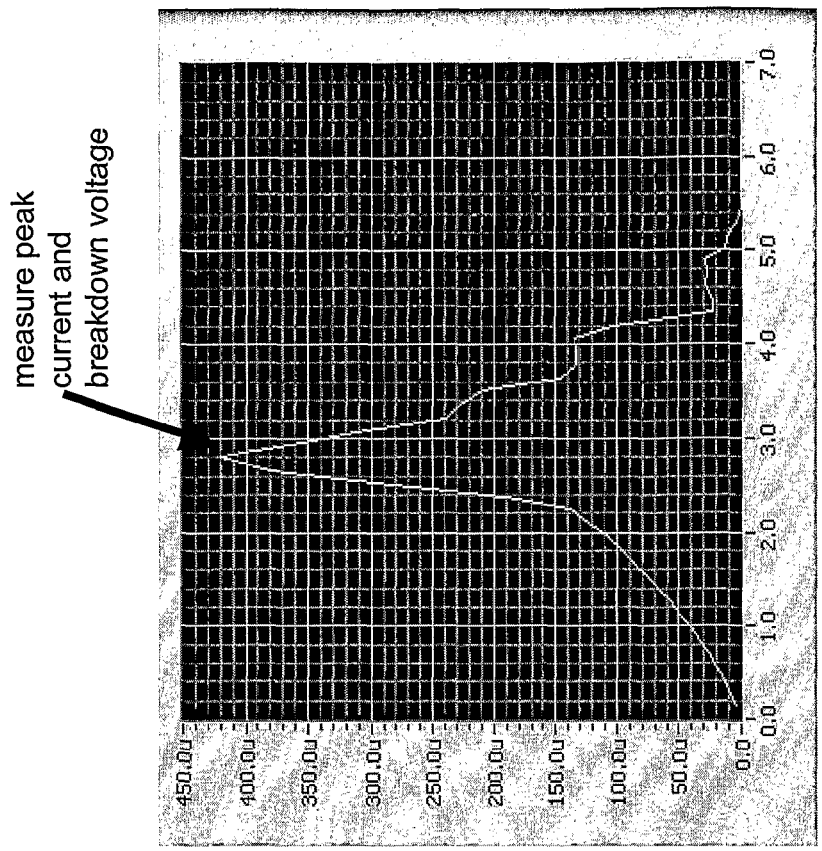
FIG. 4B shows current-voltage characteristics of an embodiment of a patterned nanotube fabric.
Figure 4A:
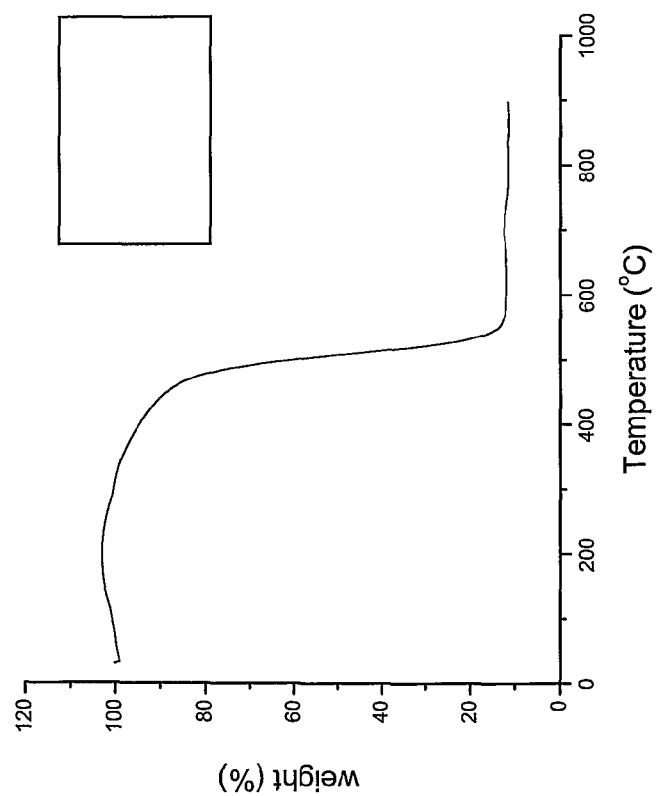
FIG. 4A shows a thermo-gravimetric-analysis of nanotubes heated in oxygen.

As stated previously, high temperatures can be produced in the nanotube fabric by passing small currents through the fabric. FIG. 4A shows Thermo-Gravimetric-Analysis (TGA) of nanotubes that were heated in oxygen. TGA operates by the burning of nanotubes in a diluted oxygen gas mixture. As the nanotubes burn in the TGA, the weight of the nanotubes decreases. The on-set of a decrease in nanotube weight establishes at which temperature the nanotubes begin to be destroyed in the TGA. Once all of the NTs are converted to gas, the weight percentage levels off. The TGA data shown in FIG. 4A can be correlated to the burning of a patterned nanotube fabric in air by passing a current through the fabric. FIG. 4B shows current-voltage characteristics of a patterned fabric deposited on a substrate as a voltage is applied to the fabric, hence a current is passed through the fabric, in air. FIG. 4B shows that at less than 3 V and less than 450 µA the resistance of the fabric begins to drastically increase, meaning that the nanotubes in the fabric are starting to be destroyed. When compared to the TGA data in FIG. 4A, these current-voltage data points to a temperature of about 450° C.

A similar correlation can be made for a suspended nanotube fabric; however, it is expected that since there is no substrate acting as an interface for the loss of heat, high temperatures may be achieved with much smaller currents and voltages.

Figure 5:
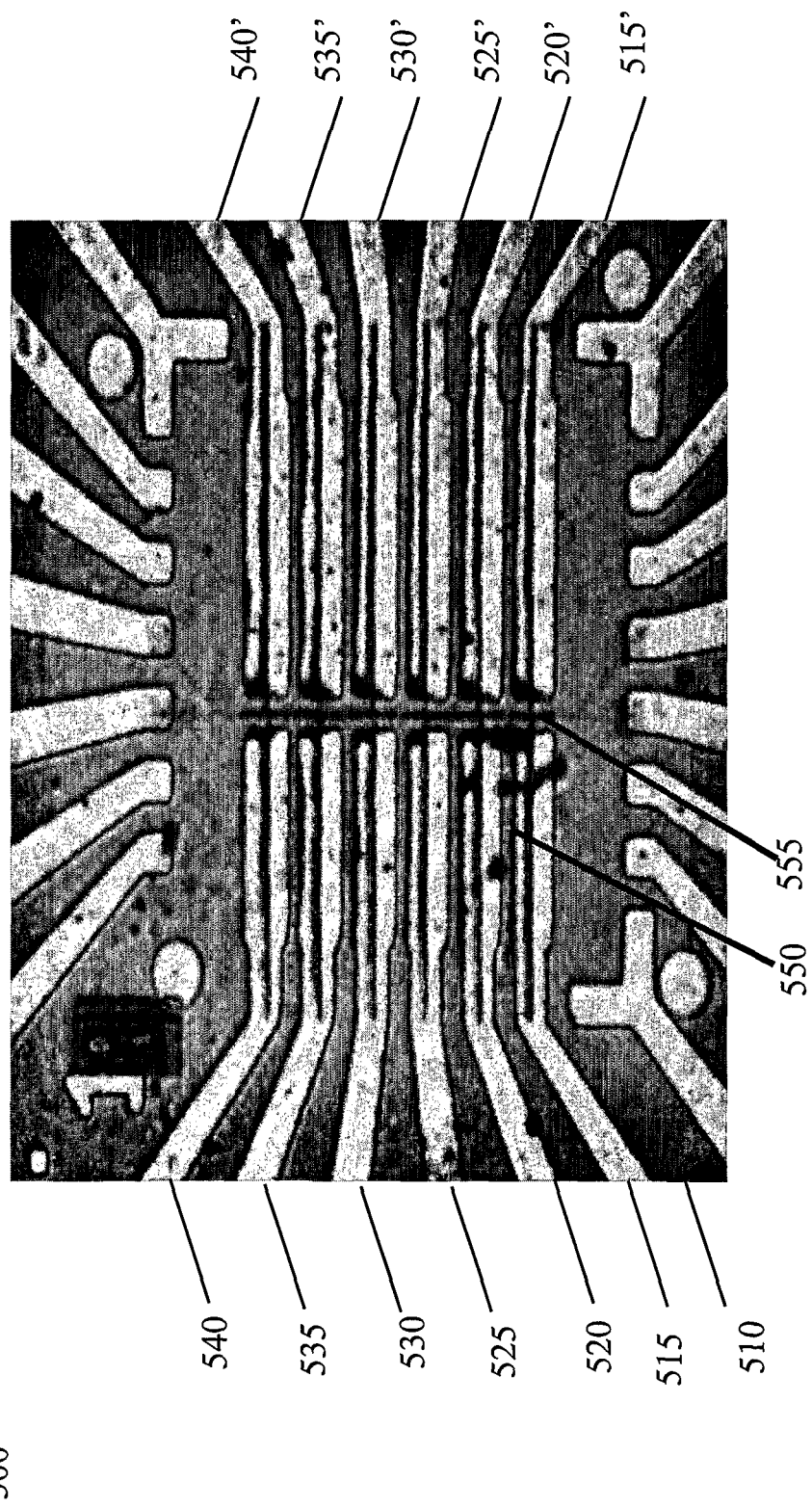
FIG. 5 is a micrograph of a column of six nanotube-based heat emitting elements according to certain embodiments of the invention.

FIG. 5 illustrates a column of six nanotube-based heat emitters. In operation, more than one emitter may be activated simultaneously; for example, all emitters may be activated simultaneously. The emitters may be activated using a dc or a pulsed source. An entire wafer may be filled with nanotube emitters and some or all of the emitters may be activated to create a heat source. The six single nanotube fabric emitters in FIG. 5 are each connected to a conductor pair (pair of conductive traces). Substrate 510 includes a silicon substrate with an oxide insulating layer of 500 nm thickness. Trenches of approximately 130 nm by 3 to 5 μM are etched in the oxide layer to form (define) the thermally insulated heat emitter region of the nanotube fabric element (depth is not critical). The trenches are temporarily filled with a sacrificial layer, PMMA (e-beam photoresist) in this example, a single wall carbon nanotube fabric layer is deposited on the surface and patterned using a hard photoresist mask, the nanotube fabric layer is etched, and the photoresist is removed. Conductor pairs 515 and 515', 520 and 520', 525 and 525', 530 and 530', 535 and 535', and 540 and 540' are deposited on the patterned nanotube fabric layer and patterned as illustrated in FIG. 5. The conductor pairs in contact with the patterned nanotube fabric are formed using 1-3 nm thick titanium and approximately 100 nm thick palladium. A trench region is formed under the nanotube layer in the gap region between conductor pairs by removing (etching) the PMMA resist in the trench thereby completing the nanotube emitter region. The nanotube emitter region is approximately 130 nm long and 3 to 5 μm wide. An electrical current is made to flow between conductor pairs and heat is emitted from the emitter region. For example, a dc voltage of approximately 5 volts may be applied between the terminals of conductor pair 515 and 515' in contact with nanotube fabric element 550 with a current flow of approximately 200 micro-Amperes (μA), resulting in emission from nanotube emitter 555.

Figure 6:
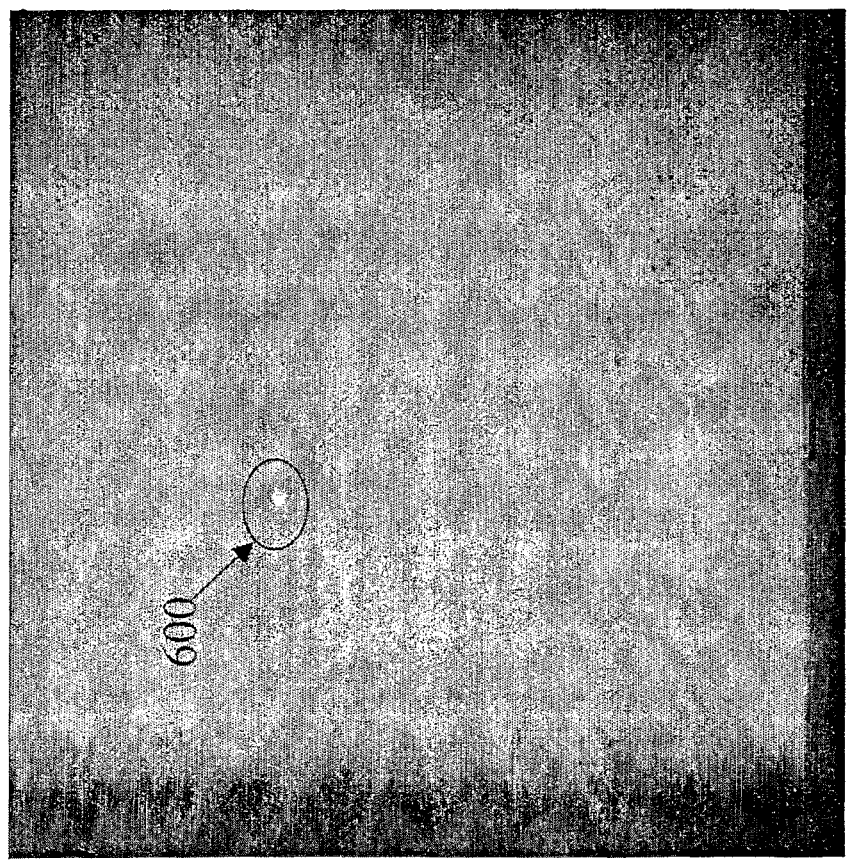
FIG. 6 is an image showing emission from one of a plurality of nanotube-based heat emitting elements according to certain embodiments of the invention.

For this device, the emission of photons also indicates heat emission—see FIG. 6, which shows bright emission 600 at −10 VDC (combined area image with light emission). The optical detection (measurement) apparatus (not shown) includes a mechanical XY table, a diffraction grating, several lenses, and an intensified ICCD (Princeton Instruments—frame transfer Pentamax 512×512×2 pixel array coupled to a Gen IV Intensifier) with an epi-illumination inverted microscope (Nikon Diaphot—TMD). The emitted photon output power is estimated as 1.3 pW of photon energy per 1 mW of input power. It should be noted that the nanotube emitter structure has not been designed for optimum power output. More details are given further below.

Control of the current flow within the devices may allow discrimination of light or heat emission in the devices. In certain embodiments chemical modification, either covalent or non-covalent can be used to assist in controlling the behavior of the nanotubes to tune the emissive properties.

The nanotube ribbon of certain embodiments is formed from a non-woven fabric of entangled or matted nanotubes. Unlike fabrication techniques which rely on directed growth or chemical self-assembly of individual nanotubes, preferred embodiments of the present invention utilize fabrication techniques involving thin films and in most cases, lithography. This method of fabrication lends itself to generation over large surfaces especially wafers of at least 2 to 8 inches. (In contrast, growing individual nanotubes over a distance beyond sub millimeter distances is currently unfeasible.) The ribbons should exhibit improved fault tolerances over individual nanotubes, by providing redundancy of conduction pathways contained within the ribbons. Moreover, the resistance value of the ribbons should be significantly lower than the resistance value of individual nanotubes, thus, decreasing its impedance, since the ribbons may be made to have larger cross-sectional areas than individual nanotubes. The heat emitting parameters of the ribbon resemble those of individual nanotubes. Thus, the predicted heat emission of the ribbon should approximate additive values for the individual nanotubes.

Nanotube Heating Elements to Change the Phase of Materials

In various embodiments, heat emitting nanofabrics can be used to controllably change the phase of materials, e.g. from non-crystalline to crystalline and back.

FIGS. 7A and 7B illustrate an exemplary phase-changing heat emitter. The nanofabric electrical input electrodes 702 and 704 activate electrical input 700 of nanofabric emitting element 712 sending a current through nanofabric emitting element 712. Nanofabric emitting element 712 having a resistance R (R is a function of temperature and increases at high temperatures) receives electrical power ($I^2R$) from electric current I and is heated to the point heat (radiation) outputs. Those skilled in the art will appreciate that metallic nanotubes generally dominate the aforementioned behavior. Heating efficiency of the nanofabric emitting element 712 is enhanced by reducing thermal conduction from the film to adjacent material that may act as a heat sink, but which changes phase. By way of example of reduced thermal conduction, the nanofabric emitting element 712 is that portion of the nanofabric element in a gap (void) region. Alternatively, nanofabric emitting element 712 is that portion of the nanofabric element supported by (in physical contact with) a layer of low thermal conductivity such as polyimide or epoxy glass, or other materials such as those previously described.

Common materials whose phase is changed upon moderate heating include chalcogenides such as $Ge_2Sb_2Te_5$, where heating produces a phase change from poly-crystalline to amorphous; and such phase changes can be read and stored as bits of memory. The current, I, may be adjusted to control the input power $I^2R$ to nanofabric emitting element 712 to emit more (or less) heat (radiation) energy in order to change the phase of the adjacent material 715 to crystalline material 715' and back again, as illustrated by FIGS. 7A and 7B.

In general, nanotube heating elements may also be used to change the phase of a wide range of materials, not just chalcogenide materials. For example, metals may have one or more crystal structures, each of which constitutes a "phase" which may be selectively changed by one or more nanotube heating elements. Other materials whose "phase" can be changed include ceramics (structural change), glasses (above or below glass transition temperature), polymers (above or below glass transition or other transition temperature) and silicides. It is also possible to produce other types of phase changes such as crystalline (poly and single) to amorphous, amorphous to crystalline (poly and single), above and below glass transition temperatures, between eutectoid phases—such as ferrite to austenite as an example—and from solid to liquid to gas.

Suspended Nanotube Heaters

FIGS. 8A-8D illustrate exemplary structures according to certain embodiments of the invention. FIG. 8A illustrates a single, horizontally-suspended heating element structure 800 having a silicon substrate 802, a source 804' and drain 804, a gate electrode 806, a gate dielectric 807, a first set of conductive electrodes 808, a chalcogenide layer 810, a nanotube fabric layer 812 and second conductive electrodes 814.

Silicon substrate layer 802 underlies source 804' and drain 804. Silicon substrate layer 802 may be n-type or p-type. A gate electrode 806 is disposed above a gate dielectric region 807. First conductive electrodes 808 contact source 804' and drain 804. One of the first conductive electrodes 808 is in electrical communication with chalcogenide layer 810. A dielectric layer 813 is disposed above the first conductive electrode 808 what is in electrical communication with chalcogenide layer 810. Chalcogenide layer 810 is disposed below a gap 818; gap 818 is disposed below a nanotube fabric (heat emitting) layer 812. In other words, gap 818 separates chalcogenide layer 810 from nanotube layer 812. A second set of conductive electrodes 814 contacts nanotube fabric layer 812 such that current may flow from one of the second electrodes 814 to the other of the second electrodes 814 through the fabric layer 812.

An exploded view of the chalcogenide active region 809 is illustrated in FIG. 8B. Heat emitted by the nanofabric 812, illustrated as the set of downward-facing arrows within gap 818, changes amorphous chalcogenide 810 to crystalline chalcogenide 816. The conductive electrodes 808 and 808' are used to gauge the resistance of the chalcogenide, and thus to deduce its phase. Control and memory output/READ/WRITE electrodes are not shown, but one skilled in the art will understand that they are interconnected within the memory system. FIG. 8C illustrates a different embodiment, which includes a horizontally-suspended heating element structure 817. In this alternate embodiment, the placement of electrodes and insulating regions is slightly changed. As can be seen in FIG. 8C, a first conductive electrode 808 contacts a lower section of the chalcogenide layer 810.

FIG. 8D illustrates a chalcogenide memory element structure 822 having two suspended heating elements 812. The structure 822 shares most of the same features as structure 800. Gaps 824 and second conductive electrodes 826 are shown. The presence of a second heating element lends itself to advantages over a single-element heating system, including increased speed of heating and redundancy within the structure and more uniform heating of the chalcogenide material. Since the chalcogenide is heated from both sides, it should be expected that the phase change rate should also be increased, compared to a single heater (power density on the chalcogenide is doubled).

Figure 9:
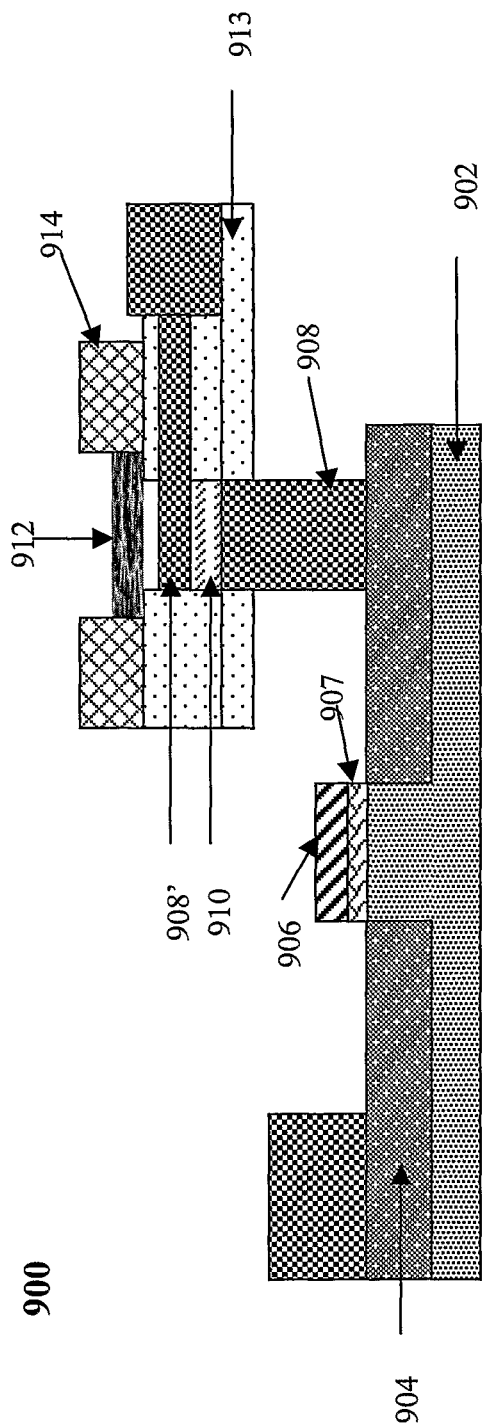
FIG. 9 illustrates a nanotube-based heating element according to certain embodiments of the invention.

FIG. 9 illustrates an alternate embodiment of the invention having a horizontal, suspended fabric heating element and chalcogenide layer contacted by metal. Structure 900 includes a silicon substrate 902, a source 904 and drain 904, a gate electrode 906, a gate dielectric 907 a first set of conductive electrodes 908, a chalcogenide layer 910, a nanotube fabric layer 912 and second conductive electrodes 914. Structure 900 has many of the features of structure 800, illustrated in FIG. 8A with the addition of an extended metal-chalcogenide contact 908' in contact with chalcogenide layer 910. Therefore, nanotube fabric will heat both the metal extension 908' and the chalcogenide layer 910. FIG. 9 is an additional design of a CRAM memory element that may simplify the fabrication of the memory cell.

Non-Suspended Nanotube Heaters

FIGS. 10A-10E illustrate various other embodiments of the invention. For these figures, the in-line transistor has been eliminated from the schematics; however, one knowledgeable in the art understands that the lower electrodes 1008 may be connected to the source-drain region of a CMOS transistor or other control element(s).

FIG. 10A illustrates a chalcogenide memory element having two nanotube nanofabric heating elements 1012 and 1012' in contact with a chalcogenide region 1010. Lower electrode 1008 connects to nanotube 1012; while, upper electrode 1008' connects to upper nanotube fabric 1012'. The nanotube fabrics 1012 and 1012' are separated by insulating layer 1013, which also substantially encapsulates chalcogenide 1010. Note that nanotube fabrics 1012 and 1012' may extend beyond chalcogenide material 1010 as shown in FIG. 10A or nanofabrics 1012 and 1012' may terminate within or at the outer edges (away from electrodes 1008 and 1008') of chalcogenide 1010 (not shown).

This structure operates by passing a current through lower electrode 1008 and lower nanotube fabric 1012, which produces heat and causes a phase change in 1010 and the interface between 1012 and 1010. The state of the chalcogenide 1010 is then probed by passing a voltage pulse through the device from lower electrode 1008, to nanotube fabric 1012, chalcogenide 1010, upper nanotube fabric 1012' and upper electrode 1008', measuring a change in the resistance of chalcogenide 1010. Since this is a double nanotube heater design, the current may also be passed through upper electrode 1008' and nanotube fabric 1012' to change the phase of the chalcogenide 1010.

FIG. 10B illustrates another embodiment of a two-heating-element chalcogenide memory element structure 1002 having many of the same elements as structure 1000 but the fabric heating elements 1012 and 1012', chalcogenide region 1010 and dielectric regions 1013 are disposed between conductive electrodes 1008 and 1008'. This design does not require the creation of vias and gaps in the CRAM cell, and thus may be fabricated more simply than the embodiments illustrated in FIGS. 8A-8D. However, the non-suspended fabrics may not heat as readily as the suspended fabrics due to the loss of heat to the relatively larger substrate.

FIG. 10C illustrates structure 1002, an embodiment of a chalcogenide memory element having a single fabric heating element 1012 in contact with a chalcogenide region 1010 having a conductive electrode 1008 and 1008' and dielectric regions 1013. This design includes only one nanotube fabric 1012 to be deposited and patterned.

Figure 10D:
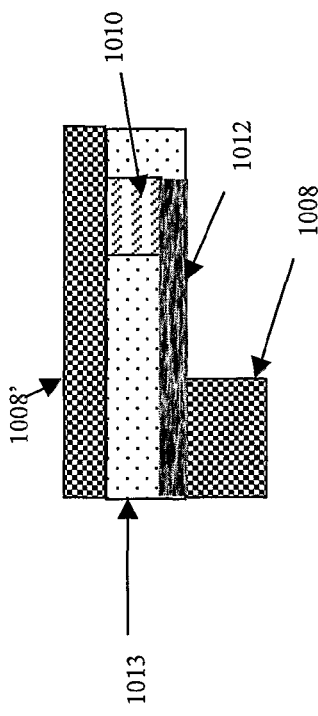

FIG. 10D shows another embodiment of a non-suspended device, in which nanotube fabric 1012 is deposited on top of electrode 1008, which makes contact to additional circuitry. The nanotube fabric is also contacted to chalcogenide material 1010 by the deposition of chalcogenide onto one end of nanotube fabric 1012. The chalcogenide material may be completely deposited on top of the nanotube fabric or may be off-set so that only a small portion of the chalcogenide material is contacting the nanotube fabric. An over-lap of 10 nm up to the critical dimension (i.e. 150 nm for 150 nm dimensional node) of the chalcogenide is envisioned. The non-nanotube contacted edge of chalcogenide 1010 is further connected to conductive electrode 1008'. This simplified design operates by passing a current through nanotube heating fabric 1012 by route of electrode 1008. The heating of nanotube fabric 1012 causes the phase of chalcogenide 1010 to change from a crystalline phase to an amorphous phase (as seen in FIG. 8). After changing the phase of chalcogenide 1010, a smaller probe voltage is applied through electrode 1008, nanotube fabric 1012, chalcogenide 1010 and electrode 1008' to sense the high resistance state of chalcogenide 1010.

Figure 10E:
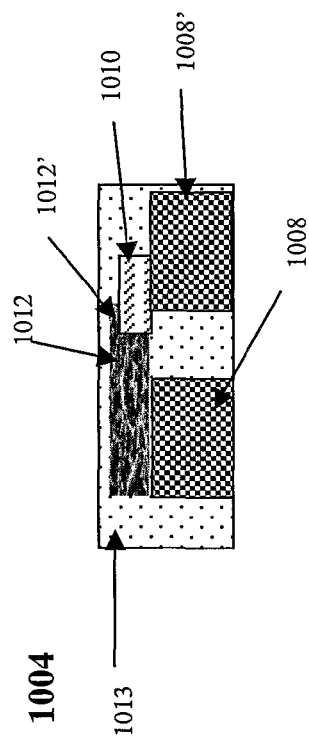

FIG. 10E shows another embodiment, which is similar to FIG. 10D except that nanotube fabric 1012 is deposited on top of chalcogenide 1010 with nanotube over-lapping region 1012' (region where nanotube is deposited on top of chalcogenide 1010), changing the heating profile of chalcogenide 1010 compared to FIG. 10D. Electrode 1008' may be deposited below (as shown) or on top of chalcogenide 1010 (not shown). If electrode 1008' is deposited on top of chalcogenide 1010, then care must be taken that nanotube fabric 1012' does not contact electrode 1008'.

Vertically Disposed Suspended Nanotube Heaters

FIGS. 11A-11D illustrate embodiments of chalcogenide memory elements having vertically disposed fabric heating elements. FIGS. 11A-B show non-suspended vertical devices while FIGS. 11C-D show suspended vertical devices.

Structure 1100 has silicon substrate layer 1102, source 1104' and drain 1104, gate 1106, gate dielectric 1107, first conductive (or lower) electrode 1108, upper conductive electrode 1108', insulator region 1113, vertically-aligned nanotube heating element 1112, chalcogenide region 1110, and second conductive electrodes 1114 as illustrated in FIG. 11A. Fabrication of such vertically disposed fabric layers is fully described in the incorporated patent references and is not repeated here for the sake of brevity.

FIG. 11B illustrates structure 1117, a chalcogenide memory element having two fabric heating elements 1112 and 1112' in contact with a chalcogenide region 1110. Many of the elements in structure 1100 are the same as the elements in structure 1117, with the addition of the second heating element (1112'), dielectric regions 1113 insulating the heating elements from conductive electrodes 1108 and 1108'.

FIGS. 11C and 11D illustrate chalcogenide memory elements having suspended, vertically aligned heating elements. Structure 1118 has a gap 1120 separating fabric heating element 1112 from chalcogenide region 1110, as illustrated in FIG. 11C. One skilled in the art will understand how to fabricate such suspended regions as these elements are analogous to those elements described in incorporated references, see, e.g. U.S. patent application Ser. No. 10/776,572 entitled "Devices Having Vertically-Disposed Nanofabric Articles and Methods of Making the Same", filed Feb. 11, 2004. FIG. 11D illustrates structure 1119 having two fabric heating elements 1112 and 1112' separated from chalcogenide region 1110 by gaps 1120 and 1120' and spaced by dielectric layers 1113 and 1113'.

Figure 12A:
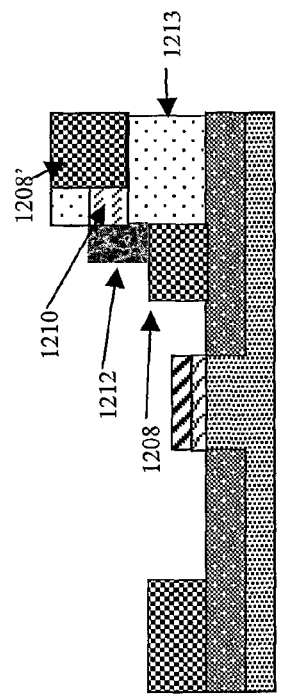
FIGS. 12A-12B illustrate various embodiments of nanotube-based heating elements.
Figure 12B:
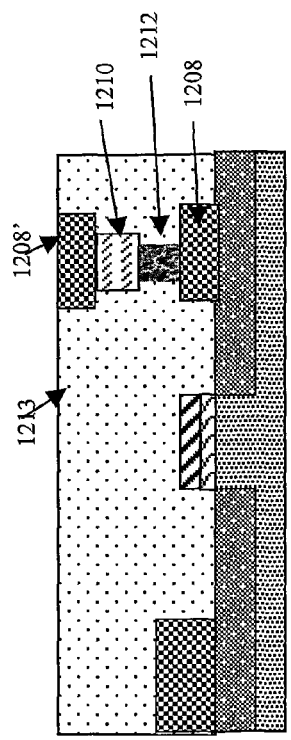

FIGS. 12A-12B show other embodiments of vertically-oriented nanotube heaters used to change the phase of chalcogenide material. In FIG. 12A, the vertical nanofabric 1212 contacts one side of the chalcogenide material 1210, while in FIG. 12B, the nanotube fabric 1212 only contacts a minimum amount of chalcogenide 1210 on the order of the thickness of the nanotube fabric (minimum of 1.5 nm maximum of several tens of nanometers for multilayered fabric). The width of the fabric (dimension into the page) is tailored through the patterning of the vertically oriented fabric with a minimum of several nanometers and a maximum of several microns possible. Similar to previous design 1208 and 1208' are upper and lower electrodes, respectively and 1213 is an insulating layer.

Devices such as heat emitting filaments can be constructed using nanofabrics that conform to a surface which is substantially perpendicular to a semiconductor substrate (i.e., "vertically-oriented"), and that such devices can be used as vertically oriented switches in a plethora of applications. Fabrication techniques to develop such horizontally- and vertically-disposed fabrics and devices composed of nanotube fabrics which comprise redundant conducting nanotubes may be created via CVD, or by room temperature operations as described herein and described in the incorporated patent references. Such fabrication techniques include the ability to form said suspended heat emitters for use in many different articles having relatively short spans of suspended nanofabric articles. In some embodiments, this allows smaller device dimensions and higher strains in the nanofabric articles, as well as lower electrical resistances. Such articles may be adapted or modified to perform function within the electronics industry such as heat or heat emission or be part of a scheme involving transmission or storage functionality.

In another embodiment, the heating element is disposed adjacent to or contacting a material, which need not have crystallizing behavior but could be a conductor, insulator or have some other property that is affected by the transfer of heat.

FIGS. 13A-13B show another embodiment of this invention where an initially amorphous chalcogenide material 1311 is employed rather than an initially crystalline chalcogenide 1310. For this device, structure 1300 shows a nanotube fabric 1312, which shows a fabric with individual nanotubes, deposited on top of a lower electrode 1308 and insulator 1313. Instead of crystalline chalcogenide material, amorphous chalcogenide material 1311 is then deposited on top of nanotubes 1312. A crystalline chalcogenide material 1310 is then deposited on top of the amorphous chalcogenide 1311 followed by an upper electrode 1308'. It is also possible to remove the crystalline chalcogenide layer 1310 and have the upper electrode 1308' deposited directly on top of amorphous chalcogenide layer 1311.

FIG. 13B shows the operation of this device in that as the nanotube fabric is heated, conductive channels 1310' are formed around the nanotubes, bridging the conductive nanotubes to the crystalline chalcogenide 1310 or upper electrode 1308'. Other designs, e.g., designs similar to those presented in FIGS. 8A-8D, 9, 10A-10E, 11A-11D, and—12A-12B, are also possible. In this embodiment, the chalcogenide device is normally in the high resistance position and thinner chalcogenide layers would be required as long as a conductive channel can be formed to the upper electrode. It may be possible to deposit a thin layer of amorphous chalcogenide of the same order of thickness as the nanotube fabric to make this type of device.

Although the main route for probing the change of phase for a chalcogenide device such as those presented in FIGS. 8-13 is by the measuring of a resistance change, the inventors also envision the ability to measure a phase change in the chalcogenide material by measuring a change in wavelength of a laser that is impinged on the chalcogenide material. This technique is readily known in the art and is similar to the operation of CD-RWs and recordable DVDs.

Figure 14:
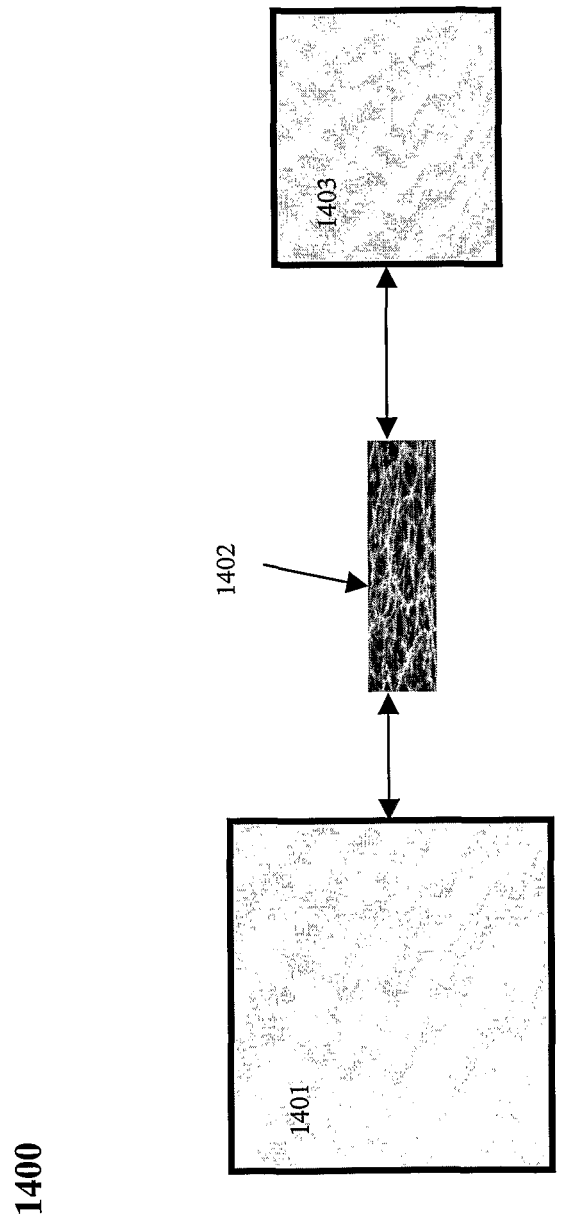
FIG. 14 illustrates a nanotube-based heating element according to various embodiments of the invention.

FIG. 14 illustrates a nanotube apparatus 1400 under another embodiment of the nanotube heating element. A drive circuit 1401 controls the application of electrical stimulus to the nanotube element. Dependent upon the particular application, the drive circuit is capable of providing a predefined current through contact electrodes to the nanotube element. In a preferred embodiment, the nanotube element 1402 is a heat-emitting portion of nanotube fabric of a predefined geometry. The current from the drive circuit controls the amount of heat emitted from the nanotube element and the time period over which heat is emitted. Element 1403 is an article to be heated by the nanotube element positioned in proximity to nanotube element 1402. In a preferred embodiment the article is a material capable of changing its physical state in response to temperature changes. The application of heat by the nanotube element induces in the article a predetermined temperature change capable of inducing a phase change in the article.

As is described above, the nanotube apparatus may be used, in preferred embodiments, as a CRAM circuit. For CRAM applications, the article to be heated 1403 is a chalcogenide material in which phase change correlates with a change of memory state. By varying the geometry of the nanotube element 1402 and the electrical stimulus applied to it by the drive circuit 1401, the amount of heat emitted by the nanotube element can be adjusted to suit the various applications. The electrical stimulus applied by the drive circuit 1401 to control heat emission from the nanotube element 1402 is determined from variables including: resistance of the nanotube element, resistance of the contact electrodes, whether the nanotube element is in direct contact with the article to be heated or suspended over a gap, and the electrical and thermal properties of supporting structure materials. As described above, it was found that temperature changes of, e.g., several hundred Kelvin in the nanotube element can be induced on a very short timescale (e.g., down to sub-picosecond) by passing through the nanotube element very small currents (e.g., less than about 100 μA). This method of emitting heat from a nanotube element provided in FIG. 14 may be useful in CRAM applications.

The following commonly-owned patent references, referred to herein as "incorporated patent references," describe various techniques for creating nanotube elements (nanotube fabric articles, which may be used as heat emitters), e.g., creating and patterning nanotube fabrics, and are incorporated herein by reference in their entireties:

U.S. patent application Ser. No. 09/915,093, Electromechanical Memory Array Using Nanotube Ribbons and Method for Making Same, filed Jul. 25, 2001, now U.S. Pat. No. 6,919,592;

U.S. patent application Ser. No. 09/915,095, Hybrid Circuit Having Nanotube Electromechanical Memory, filed Jul. 25, 2001, now U.S. Pat. No. 6,574,130;

U.S. patent application Ser. No. 09/915,173, Electromechanical Memory Having Cell Selection Circuitry Constructed with Nanotube Technology, filed Jul. 25, 2001, now U.S. Pat. No. 6,643,165;

U.S. patent application Ser. No. 10/033,032, Methods of Making Electromechanical Three-Trace Junction Devices, filed Dec. 28, 2001, now U.S. Pat. No. 6,784,028;

U.S. patent application Ser. No. 10/033,323, Electromechanical Three-Trace Junction Devices, filed Dec. 28, 2001 now U.S. Pat. No. 6,911,682;

U.S. patent application Ser. No. 10/128,117, Methods of Nanotube Films and Articles, filed Apr. 23, 2002, now U.S. Pat. No. 6,835,591;

U.S. patent application Ser. No. 10/128,118, Nanotube Films and Articles, filed Apr. 23, 2002, now U.S. Pat. No. 6,706,402;

U.S. patent application Ser. No. 10/341,005, Methods of Making Carbon Nanotube Films, Layers, Fabrics, Ribbons, Elements and Articles, filed on Jan. 13, 2003;

U.S. patent application Ser. No. 10/341,054, Methods of Using Pre formed Nanotubes to Make Carbon Nanotube Films, Layers, Fabrics, Ribbons, Elements and Articles, filed Jan. 13, 2003;

U.S. patent application Ser. No. 10/341,055, Methods of Using Thin Metal Layers to Make Carbon Nanotube Films, Layers, Fabrics, Ribbons, Elements and Articles, filed Jan. 13, 2003;

U.S. Pat. Application No. 10/341,130, Carbon Nanotube Films, Layers, Fabrics, Ribbons, Elements and Articles, filed Jan. 13, 2003;

U.S. patent application Ser. No. 10/776,059, Electromechanical Switches and Memory Cells Using Horizontally-Disposed Nanofabric Articles and Methods of Making Same, filed Feb. 11, 2004;

U.S. patent application Ser. No. 10/776,572, Electromechanical Switches and Memory Cells Using Vertically-Disposed Nanofabric Articles and Methods of Making the Same, filed Feb. 11, 2004, now U.S. Pat. No. 6,924,538;

U.S. patent application Ser. No. 10/936119, Patterning of Nanoscopic Articles and Methods of Making Same, filed on Sep. 8, 2003, now Publication No. 2005/0128788; and W.O. No. 01/03,208, Nanoscopic Wire-Based Devices, Arrays and Methods of Their Manufacture, filed Jan. 11, 2001 now Publication No. US0018138.

It will be further appreciated that the scope of the present invention is not limited to the above-described embodiments but rather is defined by the appended claims, and that these claims will encompass modifications of and improvements to what has been described.

What is claimed is:

1. A method of heating an article comprising:
   positioning a nanotube element with predefined geometry in proximity to and in thermal communication with an article to be heated;
   electrically stimulating the nanotube element with a predefined electrical signal to induce the emission of a predefined amount of heat from the nanotube element over a predefined period of time;
   wherein the predefined electrical signal does not pass through the article.

2. The method of claim 1, wherein the nanotube element is separated from the article to be heated by a gap of predefined dimensions.

3. The method of claim 1, wherein the nanotube element is in physical contact with a surface of the article to be heated.

4. The method of claim 1, wherein the nanotube element comprises a non-woven fabric of unaligned nanotubes.

5. The method of claim 1, wherein a current less than about 100μA applied to the nanotube element induces a change in temperature greater than about 100 Kelvin over a time period of less than about 1 picosecond.

6. A circuit comprising:
   a phase changing material having a plurality of physical states, each state activatable in response to heat stimulus;
   a detection circuit in electrical communication with the phase changing material to detect the physical state of said material;
   a heat emitting element adjacent to the phase changing material to emit heat in response to an electrical stimulus;
   wherein said heat emitting element includes a nanotube element in thermal communication with the phase changing material and capable of transforming the physical state of said material in response to electrical stimulus; and
   wherein the electrical signal does not pass through the phase change material.

7. The circuit of claim 6, wherein the nanotube element comprises a network of unaligned nanotube segments which generally extend along a length of the element.

8. The circuit of claim 6, wherein the nanotube element comprises a non-woven fabric of unaligned nanotubes.

9. The circuit of claim 7, wherein the network of unaligned nanotube segments comprises single-walled nanotubes.

10. The circuit of claim 7, wherein the network of unaligned nanotube segments comprises multi-walled nanotubes.

11. The circuit of claim 6, further including a support structure defining a gap wherein:
   the phase changing material is positioned within the gap;
   the nanotube element is supported by the support structure and suspended over the gap;
   the suspended portion of the nanotube element is the heat-emitting active region; and the nanotube element is suspended by the support structure in a fixed spaced relation to and thermal communication with the phase changing material.

12. The circuit of claim 11, wherein the suspended portion of the nanotube element extends approximately 130 nm in one dimension and 3 to 5 µm in another dimension.

13. The circuit of claim 6, further including a support structure defining a gap wherein:
   the phase changing material is positioned within the gap;
   the nanotube element is in direct physical contact with the support structure and the phase changing material;
   the portion of the nanotube element in direct contact with the phase changing material is the heat-emitting active region; and
   the nanotube element is supported by the support structure and is in thermal and electrical communication with the phase changing material.

14. The circuit of claim 11, wherein the support structure upon which the nanotube element is suspended comprises one or more materials whose electrical properties are insulating and whose thermal properties are less thermally conductive than the nanotube element.

15. The circuit of claim 13, wherein the support structure upon which the nanotube element is disposed comprises one or more materials whose electrical properties are insulating and thermal properties are less thermally conductive than the nanotube element.

16. The circuit of claim 13, the support structure is interposed between the active region of the nanotube heating element and the phase changing material.

17. The circuit of claim 6, wherein the nanotube element is generally extended perpendicularly to the major surface of the substrate.

18. The circuit of claim 6, wherein the nanotube element is generally extended in an orientation parallel to the major surface of the substrate.

19. The circuit of claim 6, wherein the detection circuit comprises at least two conductive electrodes in electrical communication with the phase changing material and capable of using an electrical stimulus to measure an electrical resistance of the phase changing material, wherein said electrodes are not in electrical communication with the nanotube element.

20. The circuit of claim 6, wherein the detection circuit comprises at least two conductive electrodes capable of applying electrical stimulus to the nanotube element and measuring the resistance of the phase changing material.

21. The circuit of claim 6, wherein the phase changing material is in thermal and electrical communication with a second nanotube element spatially separated from the previously mentioned nanotube element by a support structure.

22. The circuit of claim 6, wherein the phase-changing material comprises a chalcogenide capable of at least two memory states.

23. A method of making a heat sensitive memory circuit, the method comprising:
   providing a substrate with a defined portion of phase change material;
   forming a nanotube element in proximity to the phase change material; and
   providing a drive circuit in electrical communication with the nanotube element to electrically stimulate the nanotube element and induce said element to generate heat;
   wherein the drive circuit does not pass a signal through the phase change material.

* * * * *